United States Patent
Hori

(10) Patent No.: US 9,520,847 B2
(45) Date of Patent: Dec. 13, 2016

(54) SWITCHING AMPLIFIER AND TRANSMITTER USING SAME

(71) Applicant: NEC CORPORATION, Tokyo (JP)

(72) Inventor: Shinichi Hori, Tokyo (JP)

(73) Assignee: NEC CORPORATION, Tokyo (JP)

( * ) Notice: Subject to any disclaimer, the term of this patent is extended or adjusted under 35 U.S.C. 154(b) by 47 days.

(21) Appl. No.: 14/398,299

(22) PCT Filed: Apr. 5, 2013

(86) PCT No.: PCT/JP2013/060496
§ 371 (c)(1),
(2) Date: Oct. 31, 2014

(87) PCT Pub. No.: WO2013/175876
PCT Pub. Date: Nov. 28, 2013

(65) Prior Publication Data
US 2015/0084691 A1 Mar. 26, 2015

(30) Foreign Application Priority Data

May 25, 2012 (JP) ................................. 2012-119891
Jan. 29, 2013 (JP) ................................. 2013-014214

(51) Int. Cl.
*H03F 3/217* (2006.01)
*H03K 17/687* (2006.01)
(Continued)

(52) U.S. Cl.
CPC .......... *H03F 3/2171* (2013.01); *H03F 1/0216* (2013.01); *H03F 1/0244* (2013.01);
(Continued)

(58) Field of Classification Search
CPC .... H03F 3/217; H03F 2200/03; H03F 1/0277; H03F 2200/451; H03F 3/2178; H03F 1/083; H03F 2200/372; H03F 3/181; H03F 3/185; H03F 3/2171; H03F 2200/351; H03F 3/19; H03F 1/0205; H03F 3/183; H03F 2200/432; H03F 3/2173; H03F 1/34
(Continued)

(56) References Cited

U.S. PATENT DOCUMENTS 5,666,280 A * 9/1997 Janaswamy ........... H02M 7/003
363/17
5,969,964 A * 10/1999 Mangtani .............. H02M 7/538
363/132
(Continued)

FOREIGN PATENT DOCUMENTS

JP 11-346120 A 12/1999
JP 2004-056211 A 2/2004
(Continued)

OTHER PUBLICATIONS

International Search Report of PCT/JP2013/060496 dated Jun. 18, 2013.
(Continued)

*Primary Examiner* — Khanh V Nguyen
(74) *Attorney, Agent, or Firm* — Sughrue Mion, PLLC

(57) ABSTRACT

The present invention is applied to a switching amplifier that includes a first high-side gate and a first low-side gate having output terminals connected together, and a high-side driver and a low-side driver that drive the first high-side gate and the first low-side gate, respectively. In the switching amplifier of the present invention, the high-side driver includes an input switching amplifier that uses the output terminal of the first high-side gate as a power source.

12 Claims, 18 Drawing Sheets

(51) Int. Cl.
*H03F 3/24* (2006.01)
*H03F 3/193* (2006.01)
*H03F 1/02* (2006.01)

(52) U.S. Cl.
CPC ........... *H03F 3/193* (2013.01); *H03F 3/2173* (2013.01); *H03F 3/245* (2013.01); *H03K 17/687* (2013.01); *H03F 3/217* (2013.01); *H03F 2200/171* (2013.01); *H03F 2200/324* (2013.01); *H03F 2200/336* (2013.01); *H03F 2200/405* (2013.01)

(58) Field of Classification Search
USPC .............................................. 330/207 A, 251
See application file for complete search history.

(56) References Cited

U.S. PATENT DOCUMENTS

| | | | |
|---|---|---|---|
| 6,091,292 A | 7/2000 | Higashiyama et al. | |
| 7,215,189 B2* | 5/2007 | Wilhelm | H03K 17/6871 323/282 |
| 7,449,947 B2* | 11/2008 | Unnikrishnan | H03F 1/342 330/207 A |
| 8,149,027 B2* | 4/2012 | Cygan | H03F 3/2173 327/110 |
| 2010/0001701 A1 | 1/2010 | Cygan et al. | |
| 2012/0262214 A1 | 10/2012 | Hori | |

FOREIGN PATENT DOCUMENTS

| | | |
|---|---|---|
| JP | 2005-020142 A | 1/2005 |
| JP | 2006-270382 A | 10/2006 |
| JP | 4143605 B2 | 9/2008 |
| JP | 2009-005301 A | 1/2009 |
| JP | 2011-077979 A | 4/2011 |
| JP | 2012-015708 A | 1/2012 |
| JP | 2012-060568 A | 3/2012 |
| WO | 2011/078120 A1 | 6/2011 |

OTHER PUBLICATIONS

Communication dated Nov. 23, 2015, issued by the European Patent Office in corresponding European Application No. 13794743.8.

* cited by examiner

Fig.4
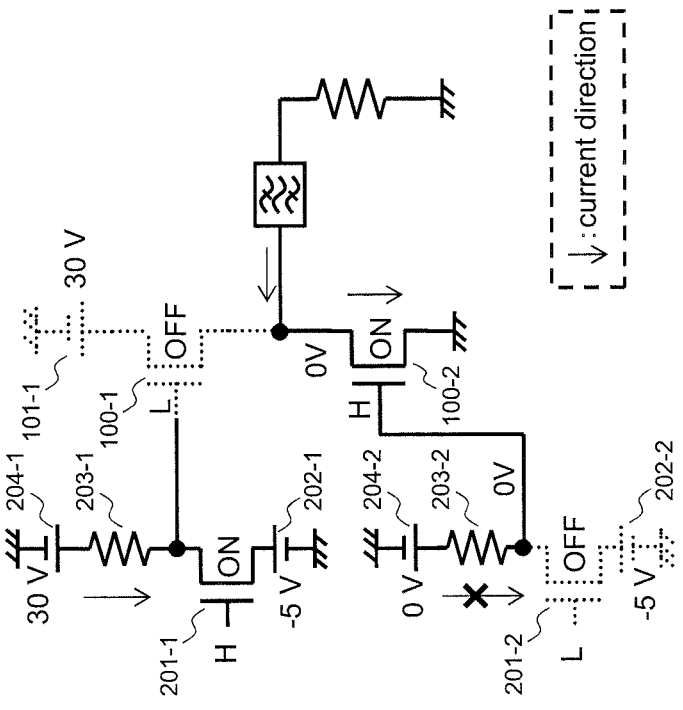
(B) when low-side voltage is to be supplied:
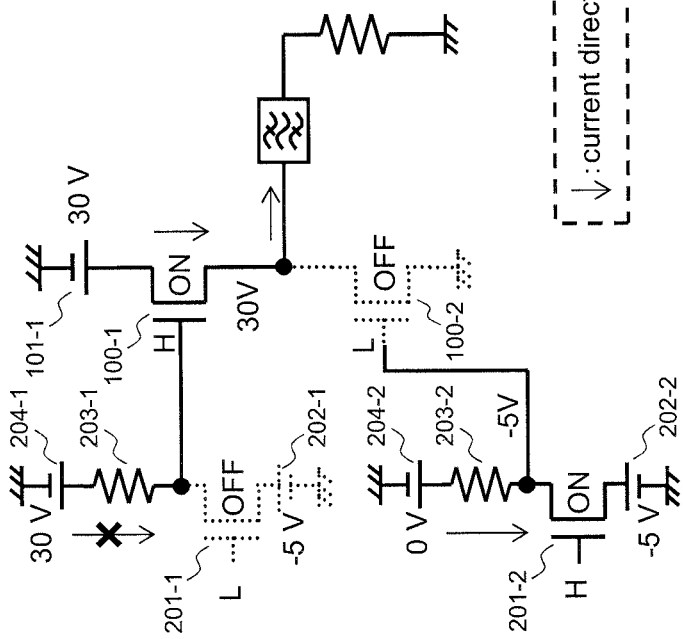
(A) when high-side voltage is to be supplied:

Fig.6
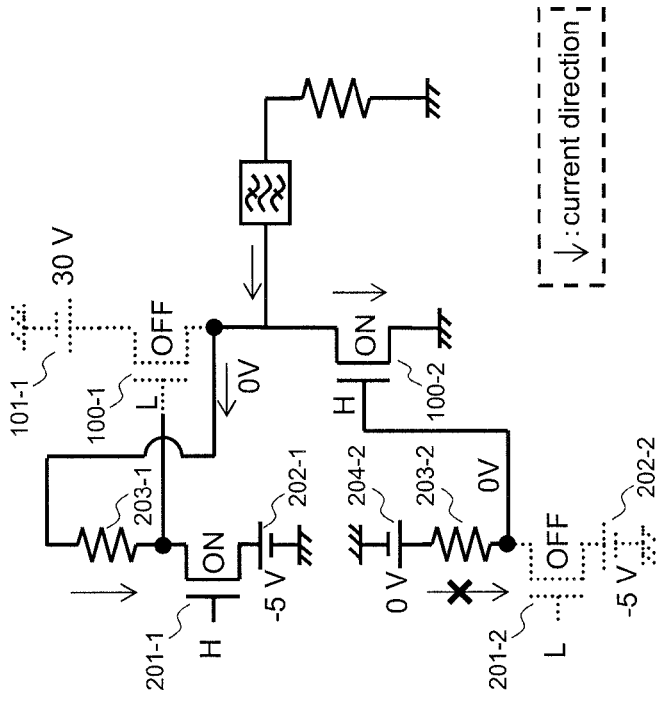
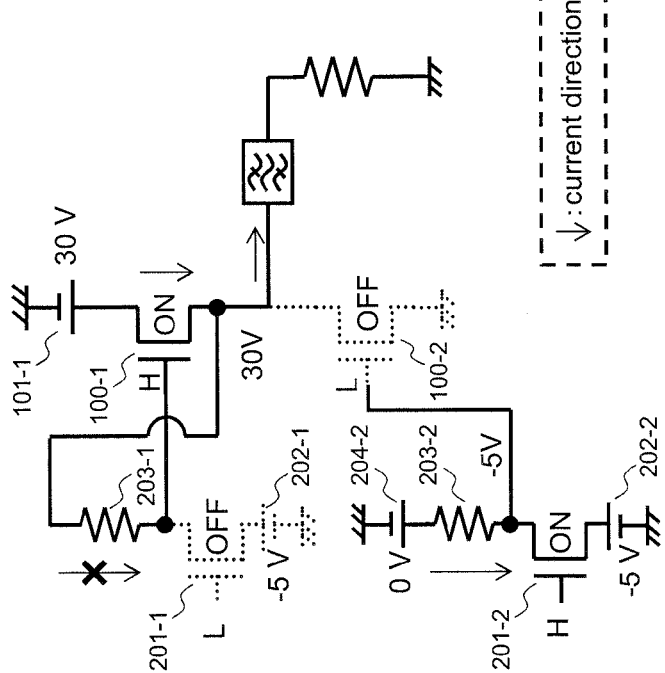

Fig.8
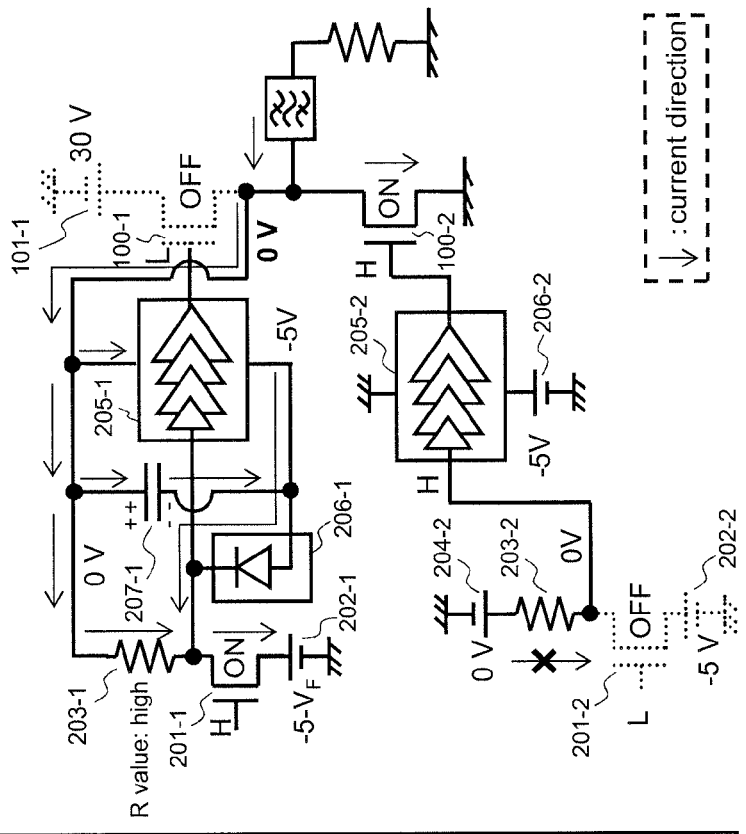
(A) when high-side voltage is to be supplied:
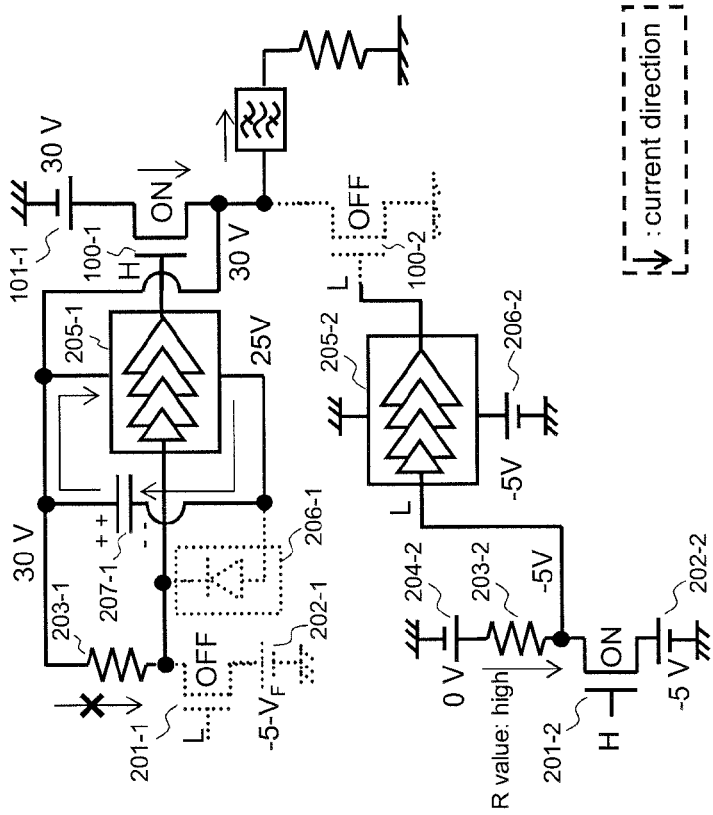
(B) when low-side voltage is to be supplied:

SWITCHING AMPLIFIER AND TRANSMITTER USING SAME

CROSS REFERENCE TO RELATED APPLICATIONS

This is a National Stage of International Application No. PCT/JP2013/060496 filed Apr. 5, 2013, claiming priority based on Japanese Patent Application No. 2012-119891 filed May 25, 2012 and Japanese Patent Application No. 2013-014214 filed Jan. 29, 2013, the contents of all of which are incorporated herein by reference in their entirety.

TECHNICAL FIELD

The present invention relates to a switching amplifier used in a transmitter such as the base station of a wireless communication system.

BACKGROUND ART

In a transmitter such as a base station of a wireless communication system, the power consumption of the power amplifier that is provided in the last stage monopolizes 50% or more of the total power consumption of the transmitter. Switching amplifiers are therefore receiving attention in recent years as power amplifiers having high power efficiency.

On the other hand, from the standpoints of efficient utilization of frequency and economy, demand is increasing for the capability to amplify and transmit signals of a plurality of frequency bands and thus handle a plurality of bands in a transmitter. As a result, the latest transmitters also include transmitters that, by combining the above-described switching amplifiers and digital modulators that are capable of flexibly converting frequency characteristics, achieve both the capability to handle a plurality of bands, and further, an improvement of power efficiency.

FIG. 1 shows an example of the configuration of a transmitter that uses a digital modulator and switching amplifier. In the following figures including FIG. 1, numerical values including voltage values and resistance values shown in the figures are only examples and are not limited to these values.

In the transmitter shown in FIG. 1, quadrature-phase baseband signals I(t) and Q(t), that are generated in digital baseband signal generator 301, are converted to amplitude signal r(t) and phase signal θ(t) in converter 302.

Phase signal θ(t) is applied as input to converter 303 together with an amplitude signal whose value is fixed to "1", and after being converted again to quadrature-phase baseband signals I(t) and Q(t), is up-converted in IQ modulator 304.

Delta-sigma modulator 305 uses the output signal of IQ modulator 304 as a clock signal to subject amplitude signal r(t) to delta-sigma modulation. Delta-sigma modulator 305 here carries out operation to supply multiple values when the carrier frequency is low (for example, 800 MHz), and in FIG. 1 supplies three values.

The output signals of delta-sigma modulator 305 are multiplied by the output signal of IQ modulator 304 in multiplier 306 and supplied to switching amplifier 307.

Corresponding to the multiple-value output of delta-sigma modulator 305, switching amplifier 307 includes the same number of switch elements and power sources as the number of values supplied from delta-sigma modulator 305. In FIG. 1, delta-sigma modulator 305 has a three-value output, and switching amplifier 307 therefore has three power sources (Vdd, Vdd/2, and GND) and three switch elements. These three switch elements are controlled so that only one switch element is ON, and the output terminals of the switch elements are connected together. The voltage of the power source that is connected to the switch element that is turned ON is thus supplied to BPF (Band-Pass Filter) 308. The output signal of multiplier 306 is accordingly amplified by one of the three voltage values.

After suppression of frequency components other than the desired frequency component (for example, the 2.14 GHz band) by BPF 308, the output signal of switching amplifier 307 is radiated into the air from antenna (load) 309.

The following description relates to the details of the configuration of a switching amplifier that is incorporated as switching amplifier 307 when delta-sigma modulator 305 has binary output in the transmitter shown in FIG. 1. In other words, the switching amplifier described below is of a configuration that supplies two voltage values: a high-side voltage value and a low-side voltage value.

The switching amplifier shown in FIG. 2 includes: high-side gate (first high-side gate) 100-1 and low-side gate (first low-side gate) 100-2; and high-side driver 200-1 and low-side driver 200-2 that drive high-side gate 100-1 and low-side gate 100-2, respectively (for example, refer to Patent Document 1).

High-side gate 100-1 is an n-channel FET. High-side gate 100-1 has its drain that serves as the power-source terminal, in which the drain is connected to power source 101-1 (power-source voltage: 30 V), and its source that serves as the output terminal, in which the source is connected to low-side gate 100-2. In addition, low-side gate 100-2 is an n-channel FET. Low-side gate 100-2 has its source that serves as the power-source terminal, in which the source is connected to ground, and its drain that serves as the output terminal, in which the drain is connected to high-side gate 100-1.

High-side driver 200-1 amplifies the output signal of multiplier 306 and applies the amplified signal as input to the gate that serves as the input terminal of high-side gate 100-1 to drive high-side gate 100-1. In addition, low-side driver 200-2 amplifies the output signal of multiplier 306 and applies the amplified signal as input to the gate that serves as the input terminal of low-side gate 100-2 to drive low-side gate 100-2.

High-side gate 100-1 and low-side gate 100-2 are controlled by high-side driver 200-1 and low-side driver 200-2 such that one turns ON and the other turns OFF. For example, power-source voltage 30V of power source 101-1 is supplied if high-side gate 100-1 is ON, and the ground voltage of ground is supplied if low-side gate 100-2 is ON.

High-side gate 100-1 and low-side gate 100-2 are assumed to be depletion-type FETs in which the potential across the gate and source is made the same in order to turn ON and the potential across the gate and source is made −5V in order to turn OFF. As a result, the output voltage of high-side driver 200-1 must be made 30V and −5V in order to turn ON and OFF, respectively, high-side gate 100-1, and the output voltage of low-side driver 200-2 must be made 0V and −5V in order to turn ON and OFF, respectively, low-side gate 100-2.

As shown in FIG. 3, high-side driver 200-1 and low-side driver 200-2 usually adopt a construction in which a resistor and a switch element are interposed between two power sources.

More specifically, high-side driver 200-1 is of a configuration in which resistor 203-1 (2Ω) and internal amplifier element 201-1 that is an n-channel FET are interposed between power source 202-1 (power-source voltage: −5V) and power source 204-1 (power-source voltage: 30V); and the drain that serves as the output terminal of internal amplifier element 201 is connected to the gate that serves as the input terminal of high-side gate 100-1.

On the other hand, low-side driver 200-2 is of a configuration in which resistor 203-2 (2Ω) and internal amplifier element 201-2 that is an n-channel FET are interposed between power source 202-2 (power-source voltage: −5V) and power source 204-2 (power-source voltage: 0V); and the drain that serves as the output terminal of internal amplifier element 201-2 is connected to the gate that serves as the input terminal of low-side gate 100-2.

The operation of the switching amplifier shown in FIG. 3 is next described with reference to FIG. 4.

(A) Operation when Supplying High-Side Voltage

The operation when supplying high-side voltage (i.e., power-source voltage 30V of power source 101-1) is first described.

When high-side voltage is to be supplied, high-side gate 100-1 is turned ON and low-side gate 100-2 is turned OFF.

For this purpose, in high-side driver 200-1, internal amplifier element 201-1 is turned OFF, and the potential across the gate and source of high-side gate 100-1 is made the same to turn ON high-side gate 100-1. In this state, current does not flow in resistor 203-1, whereby the power consumption in high-side driver 200-1 ideally becomes zero.

In low-side driver 200-2, on the other hand, internal amplifier element 201-2 is turned ON, and the potential across the gate and source of low-side gate 100-2 is made −5V to turn OFF low-side gate 100-2. In this state, current flows in resistor 203-2. At this time, the voltage drop at resistor 203-2 is 5V, and the current value becomes 2.5 A. As a result, power consumption of 12.5 W occurs instantaneously. However, considering that the power output of a macro-base station is in the order of 20 W, the power consumption in low-side driver 200-2 is suppressed to a low level.

(B) Operation when Supplying Low-Side Voltage

The operation when supplying low-side voltage (i.e., the ground voltage of the Ground) is next described.

When low-side voltage is to be supplied, low-side gate 100-2 is turned ON and high-side gate 100-1 is turned OFF.

For this purpose, in low-side driver 200-2, internal amplifier element 201-2 is turned OFF, and the potential across the gate and source of low-side gate 100-2 is made the same to turn ON low-side gate 100-2. In this state, current does not flow to resistor 203-2, whereby the power consumption in low-side driver 200-2 ideally becomes zero.

In high-side driver 200-1, on the other hand, internal amplifier element 201-1 is turned ON, and the potential across the gate and source of high-side gate 100-1 is made −5V to turn OFF high-side gate 100-1. In this state, current flows to resistor 203-1. At this time, the voltage drop at resistor 203-1 is 35V, and the current value becomes 17.5 A. As a result, the power consumption in high-side driver 200-1 instantaneously far surpasses the output power of the macro-base station and undergoes extreme increase that exceeds 600 W.

Methods of reducing the power consumption in resistor 203-1 include a method of simply increasing the resistance value of resistor 203-1, but this method results in the increase of the RC product realized by resistor 203-1 and the capacitance of high-side gate 100-1 in the following stage, whereby high-speed operation becomes impossible.

Thus, in order to maintain high-speed operation, the resistance value of resistor 203-1 must be reduced in the order of 2Ω.

CITATION LIST

Patent Documents

Patent Document 1: Japanese Unexamined Patent Application Publication No. 2006-270382

SUMMARY OF THE INVENTION

Problem to be Solved by the Invention

As described hereinabove, in a switching amplifier of the related art, the problem arises that the power consumption of the high-side driver that drives a high-side gate increases instantaneously.

It is therefore an object of the present invention to provide technology that can reduce the power consumption of a high-side driver that drives a high-side gate in a switching amplifier and thus provide a solution to the above-described problem.

Means for Solving the Problem

The switching amplifier of the present invention is a switching amplifier that includes a first high-side gate and a first low-side gate having output terminals connected together and a high-side driver and low-side driver that drive the first high-side gate and first low-side gate, respectively, wherein:

the high-side driver includes an input switching amplifier that uses the output terminal of the first high-side gate as a power source.

The transmitter of the present invention uses the switching amplifier.

Effect of the Invention

According to the switching amplifier of the present invention, an input switching amplifier in a high-side driver uses the output terminal of a first high-side gate as a power source.

Accordingly, the effect can be obtained in which, when the input switching amplifier is ON, the voltage drop at a resistor is decreased to enable a reduction of the power consumption, whereby the power consumption in the high-side driver can be reduced.

BRIEF DESCRIPTION OF THE DRAWINGS

FIGS. 4(A) and 4(B) are views for describing an example of the operation of a related switching amplifier.

FIGS. 6(A) and 6(B) are views for describing an example of the operation of the switching amplifier of the first exemplary embodiment of the present invention.

FIGS. 8(A) and 8(B) are views for describing an example of the operation of the switching amplifier of the second exemplary embodiment of the present invention.

DESCRIPTION OF EMBODIMENTS

Exemplary embodiments of the present invention are next described with reference to the accompanying drawings.

Figure 1:
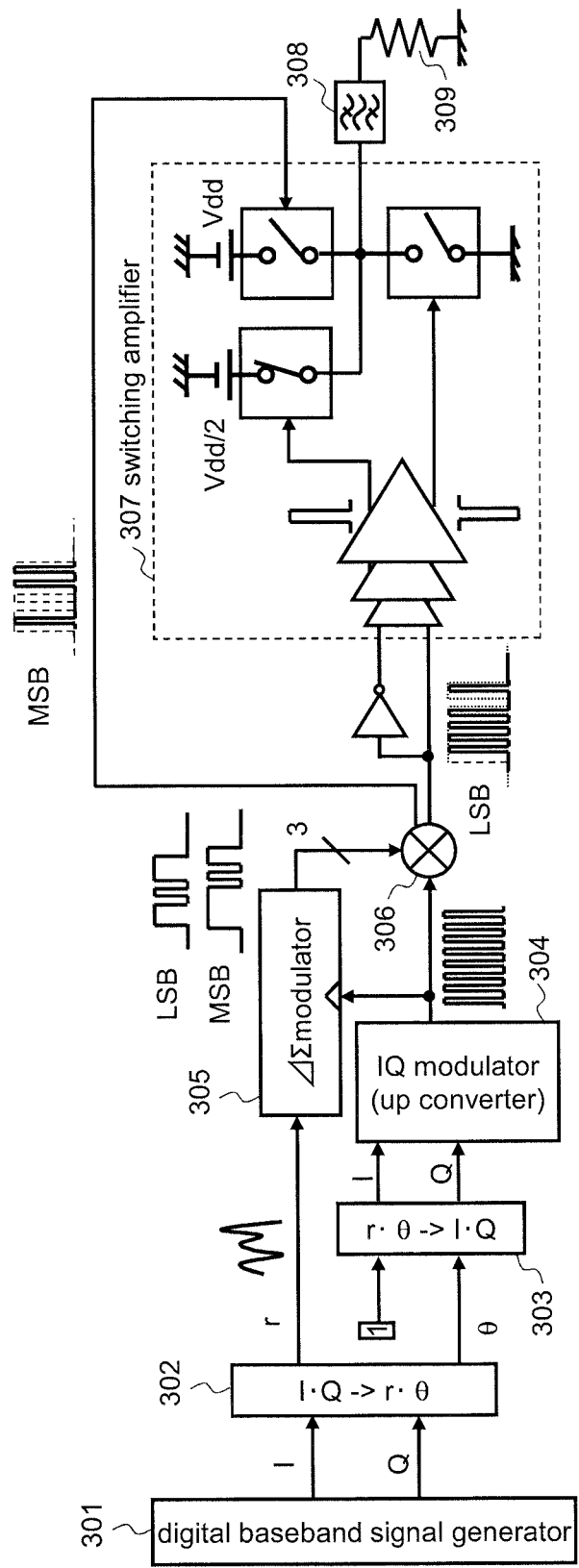
FIG. 1 is a circuit diagram showing an example of the configuration of a transmitter that uses a digital modulator and a switching amplifier.
Figure 2:
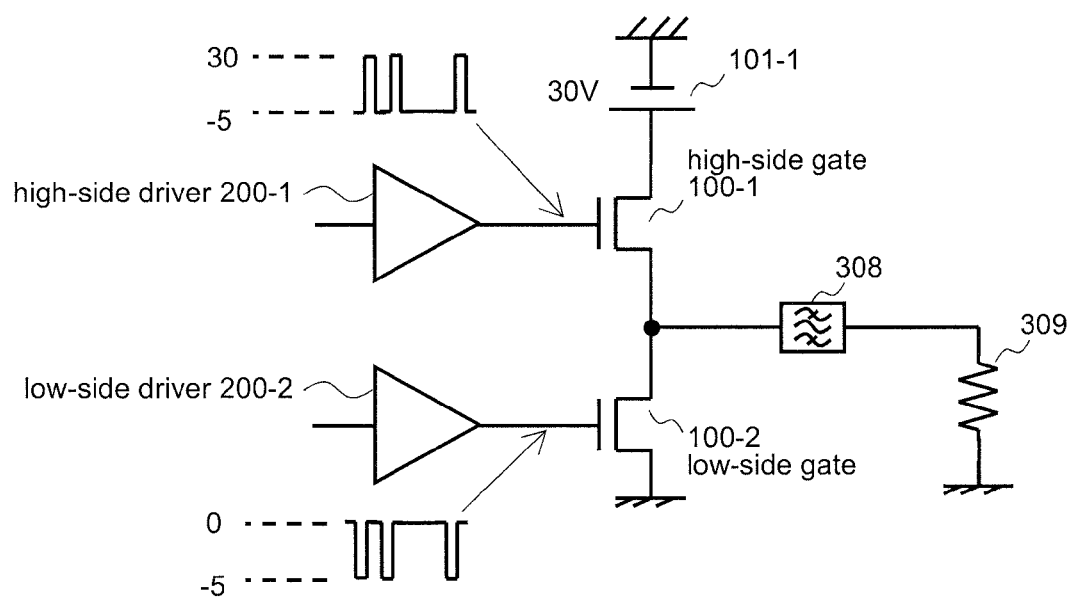
FIG. 2 is a circuit diagram showing an example of the schematic configuration of a switching amplifier.

In the following explanation, the switching amplifier of the present invention is described as being incorporated in the transmitter shown in FIG. 1 as switching amplifier 307 for a case in which delta-sigma modulator 305 has binary output.

(1) First Exemplary Embodiment

Figure 5:
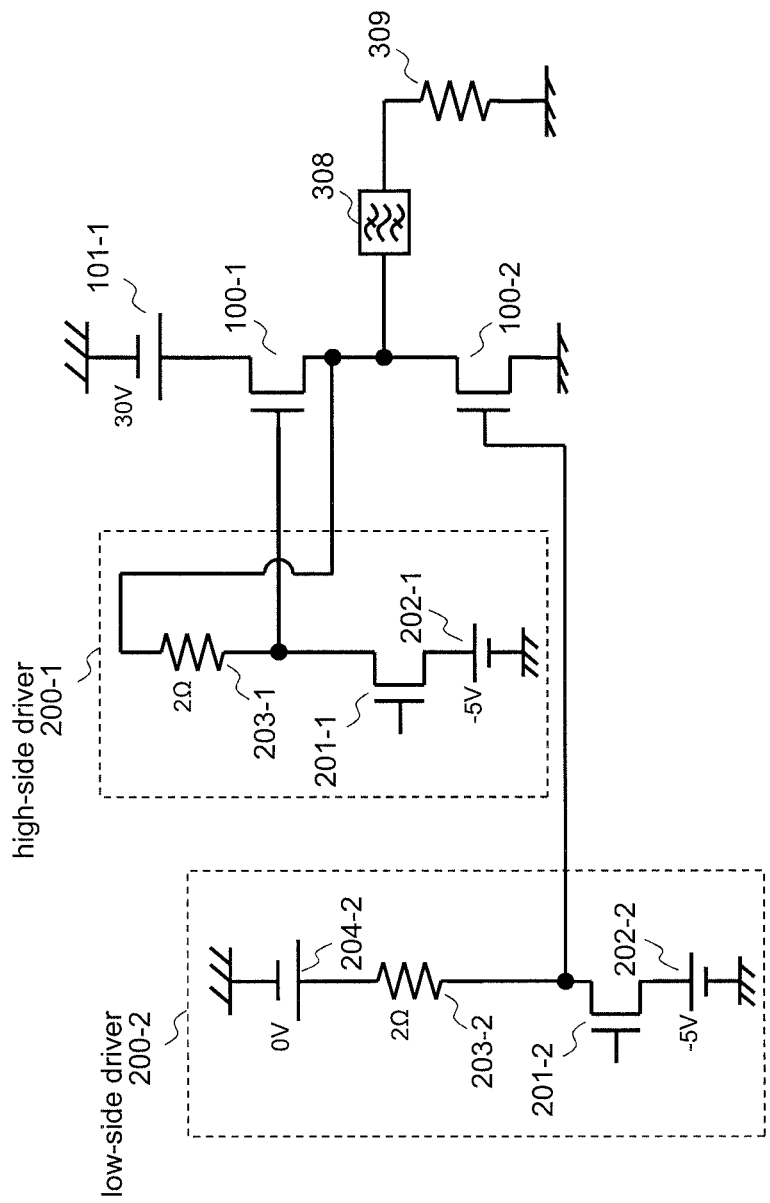
FIG. 5 is a circuit diagram showing an example of the configuration of the switching amplifier of the first exemplary embodiment of the present invention.

FIG. 5 shows an example of the configuration of the switching amplifier of the first exemplary embodiment of the present invention.

Figure 3:
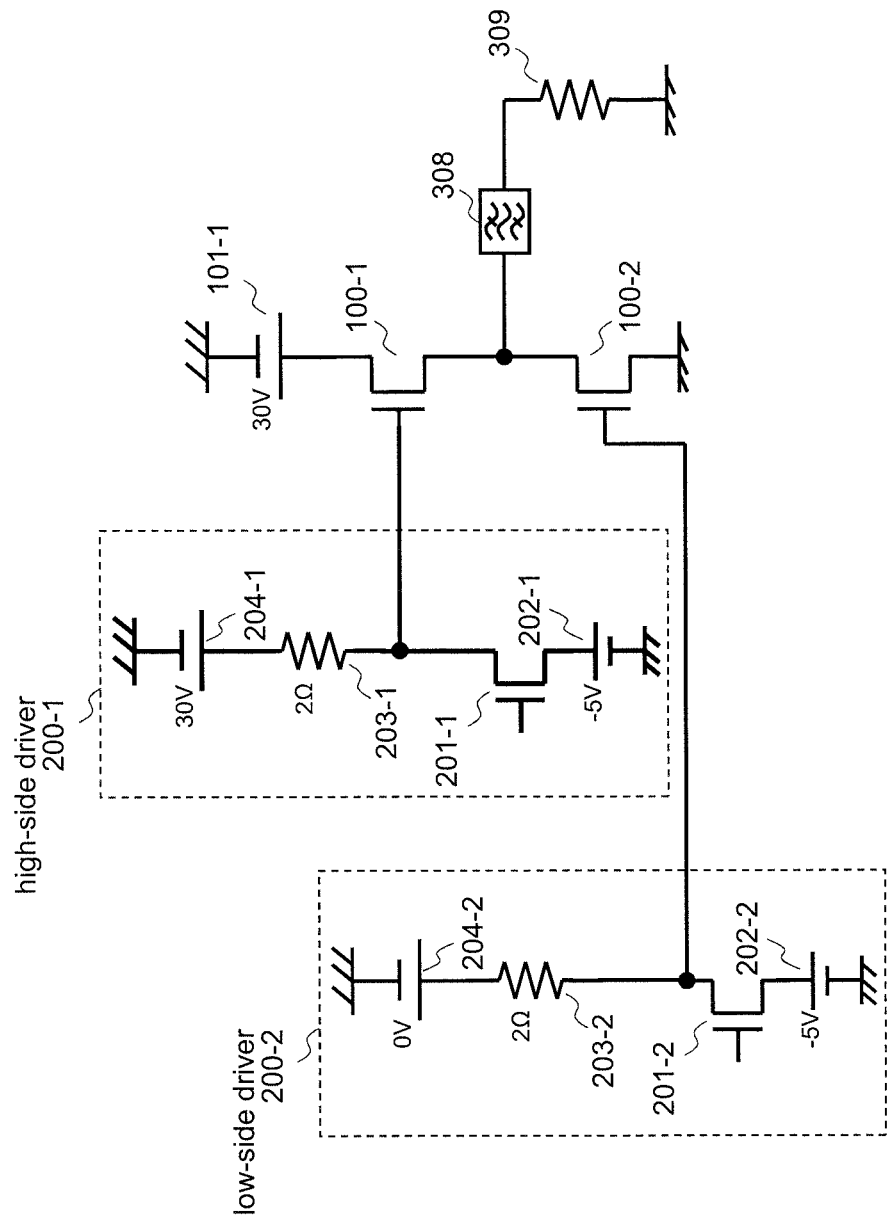
FIG. 3 is a circuit diagram showing an example of the configuration of a related switching amplifier.

As shown in FIG. 5, the switching amplifier of the present exemplary embodiment is of a configuration in which the switching amplifier shown in FIG. 3 has been modified by altering the configuration of high-side driver 200-1.

More specifically, in high-side driver 200-1 shown in FIG. 3, one terminal of resistor 203-1 is connected to the drain that serves as the output terminal of internal amplifier element 201-1, and the other terminal of resistor 203-1 is connected to power source 204-1.

In high-side driver 200-1 of the present exemplary embodiment, in contrast, power source 204-1 is eliminated, and the other terminal of resistor 203-1 is connected to the source that serves as the output terminal of high-side gate 100-1. In other words, in the present exemplary embodiment, an input switching amplifier that is made up by internal amplifier element 201-1 and resistor 203-1 is made a construction that uses the output terminal of high-side gate 100-1 as a power source.

The operation of the switching amplifier of the present exemplary embodiment shown in FIG. 5 is next described with reference to FIG. 6.

(A) Operation when Supplying High-Side Voltage

The operation when high-side voltage (i.e., power-source voltage 30V of power source 101-1) is to be supplied is first described.

When high-side voltage is to be supplied, high-side gate 100-1 is turned ON and low-side gate 100-2 is turned OFF.

For this purpose, in high-side driver 200-1, internal amplifier element 201-1 is turned OFF, and the potential across the gate and source of high-side gate 100-1 is made the same to turn ON high-side gate 100-1. In this state, current does not flow in resistor 203-1, whereby the power consumption in high-side driver 200-1 ideally becomes zero.

In low-side driver 200-2, on the other hand, internal amplifier element 201-2 is turned ON, and the potential across the gate and source of low-side gate 100-2 is made −5V to turn OFF low-side gate 100-2. In this state, current flows in resistor 203-2. At this time, the voltage drop at resistor 203-2 is 5V, and the current value becomes 2.5 A. As a result, power consumption of 12.5 W occurs instantaneously. However, considering that a macro-base station has output in the order of 20 W, the power consumption in low-side driver 200-2 is suppressed to a low level.

(B) Operation when Supplying Low-Side Voltage

The operation when supplying low-side voltage (i.e., the ground voltage of Ground) is next described.

When low-side voltage is to be supplied, low-side gate 100-2 is turned ON and high-side gate 100-1 is turned OFF.

For this purpose, in low-side driver 200-2, internal amplifier element 201-2 is turned OFF and the potential across the gate and source of low-side gate 100-2 is made the same to turn OFF low-side gate 100-2. In this state, current does not flow in resistor 203-2, whereby the power consumption in low-side driver 200-2 ideally becomes zero.

In high-side driver 200-1, on the other hand, internal amplifier element 201-1 is turned ON, and the potential across the gate and source of high-side gate 100-1 is made −5V to turn OFF high-side gate 100-1. In this state, current flows in resistor 203-1. At this time, however, the other terminal of resistor 203-1 is connected to the source that serves as the output terminal of high-side gate 100-1, and the voltage at this connection point is 0V. As a result, the voltage drop at resistor 203-1 is 5V, and the current value becomes 2.5 A. As a result, the power consumption in high-side driver 200-1 can be instantaneously decreased to 12.5 W In the present exemplary embodiment as described hereinabove, the input switching amplifier in high-side driver 200-1 uses the output terminal of high-side gate 100-1 as the power source.

Accordingly, when internal amplifier element 201-1 is ON, the voltage drop at resistor 203-1 can be made small to decrease the power consumption, whereby the effect can be obtained of enabling a decrease of the power consumption in high-side driver 200-1.

(2) Second Exemplary Embodiment

Figure 7:
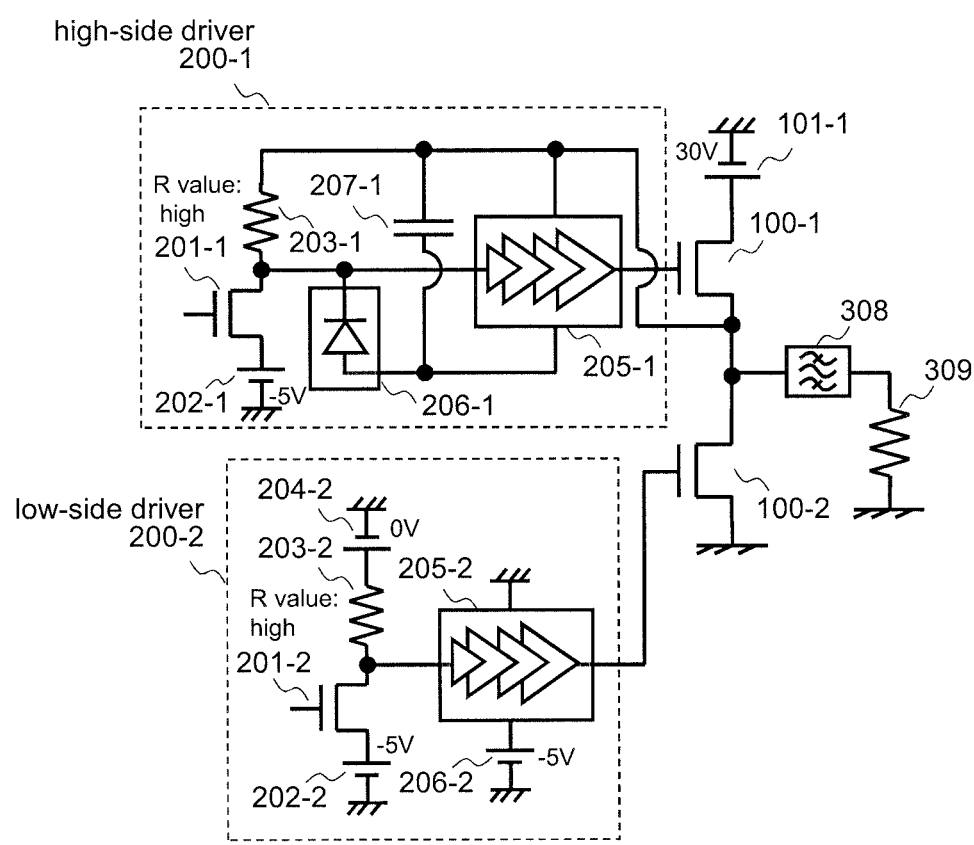
FIG. 7 is a circuit diagram showing an example of the configuration of the switching amplifier of the second exemplary embodiment of the present invention.

FIG. 7 shows an example of the configuration of the switching amplifier of the second exemplary embodiment of the present invention.

As shown in FIG. 7, the switching amplifier of the present exemplary embodiment is of a configuration in which the configurations of both high-side driver 200-1 and low-side driver 200-2 of the first exemplary embodiment shown in FIG. 5 have been altered.

More specifically, high-side driver 200-1 of the present exemplary embodiment is of a configuration in which an inverter series (relay amplifier) 205-1 having a plurality of cascade-connected inverters, diode 206-1, and capacitor 207-1 are added to the first exemplary embodiment shown in FIG. 5.

Inverter series 205-1 has its input terminal connected to the drain that serves as the output terminal of internal amplifier element 201-1, its output terminal connected to the gate that serves as the input terminal of high-side gate 100-1, its power-source terminal connected to the source that serves as the output terminal of high-side gate 100-1, and its ground terminal connected to the anode terminal of diode 206-1. In addition, diode 206-1 has its anode terminal connected to the ground terminal of inverter series 205-1 and its cathode terminal connected to the drain that serves as the output terminal of internal amplifier element 201-1. Still further, capacitor 207-1 has one terminal connected to the ground terminal of inverter series 205-1 and its other terminal connected to the power-source terminal of inverter series 205-1.

High-side driver 200-1 of the present exemplary embodiment drives high-side gate 100-1 by way of inverter series 205-1.

If the first-stage inverter of inverter series 205-1 is here made small, the RC product can be kept small even if the resistance value of resistor 203-1 is designed to be high (for example, 10Ω or 100Ω), and high-speed operation is possible. As a result, when internal amplifier element 201-1 is ON, the amount of current at resistor 203-1 can be reduced to enable a reduction of power consumption, whereby the power consumption in high-side driver 200-1 can be further reduced.

In addition, since diode 206-1 and capacitor 207-1 are provided in high-side driver 200-1 of the present exemplary embodiment, capacitor 207-1 can be charged by diode 206-1 when internal amplifier element 201-1 is ON, and when internal amplifier element 201-1 is OFF, power can be supplied to inverter series 205-1 by means of the electric charge that was accumulated in capacitor 207-1. In addition, since diode 206-1 is provided in high-side driver 200-1, the voltage of the input terminal of high-side driver 200-1 (i.e., the gate of internal amplifier element 201-1) can be prevented from falling below the ground voltage.

On the other hand, low-side driver 200-2 of the present exemplary embodiment is of a configuration in which inverter series (relay amplifier) 205-2 having a plurality of cascade-connected inverters and power source 206-2 (power-source voltage: −5 V) are added to the first exemplary embodiment shown in FIG. 5.

Inverter series 205-2 has its input terminal connected to the drain that serves as the output terminal of internal amplifier element 201-2, its output terminal connected to the gate that serves as the input terminal of low-side gate 100-2, its ground terminal connected to power source 206-2, and its power-source terminal grounded.

Similar to high-side driver 200-1, low-side driver 200-2 of the present exemplary embodiment also drives low-side gate 100-2 by way of inverter series 205-2.

Accordingly, similar to high-side driver 200-1, the amount of current at resistor 203-2 is reduced when internal amplifier element 201-2 is ON to enable a reduction of the power consumption, whereby the power consumption in low-side driver 200-2 can be further reduced.

In the present exemplary embodiment, the amount of accumulated power of capacitor 207-1 is assumed to be 5V.

The operation of the switching amplifier of the present exemplary embodiment shown in FIG. 7 is next described with reference to FIG. 8.

(A) Operation when Supplying High-Side Voltage

The operation when supplying high-side voltage (i.e., power-source voltage 30V of power source 101-1) is first described.

When high-side voltage is to be supplied, high-side gate 100-1 is turned ON and low-side gate 100-2 is turned OFF.

For this purpose, in high-side driver 200-1, internal amplifier element 201-1 is turned OFF, and high-side gate 100-1 is turned ON. At this time, power is supplied to inverter series 205-1 by means of the electric charge of 5V that was accumulated in capacitor 207-1. In this state, current does not flow in resistor 203-1 and diode 206-1 and power is only consumed in inverter series 205-1, this power consumption being at the extremely low level of the portion of the state transition loss ($CV^2f$). As a result, the power consumption in high-side driver 200-1 is suppressed to a low level.

In low-side driver 200-2, on the other hand, internal amplifier element 201-2 is turned ON, and low-side gate 100-2 is turned OFF. In this state, current flows in resistor 203-2, but the power consumption in resistor 203-2 is low, as described in the first exemplary embodiment. In the present exemplary embodiment, moreover, the power consumption in resistor 203-2 is further reduced due to the effect of inverter series 205-2. Further, the power consumption in inverter series 205-2 at this time is at the extremely low level of the portion of state transition loss ($CV^2f$). As a result, the power consumption in low-side driver 200-2 can be further reduced compared to the first exemplary embodiment.

(B) Operation when Supplying Low-Side Voltage

The operation when low-side voltage (i.e., the ground voltage of Ground) is to be supplied is next described.

When low-side voltage is to be supplied, low-side gate 100-2 is turned ON and high-side gate 100-1 is turned OFF.

For this purpose, in low-side driver 200-2, internal amplifier element 201-2 is turned OFF, and low-side gate 100-2 is turned ON. In this state, current does not flow in resistor 203-2 and power is consumed only in inverter series 205-2, this power consumption being at the extremely low level of the portion of state transition loss ($CV^2f$). As a result, power consumption in low-side driver 200-2 is suppressed to a low level.

In high-side driver 200-1, on the other hand, internal amplifier element 201-1 is turned ON, and high-side gate 100-1 is turned OFF. Although current flows in resistor 203-1 in this state, the power consumption in resistor 203-1 is low, as described in the first exemplary embodiment. In the present exemplary embodiment, moreover, power consumption at resistor 203-1 is further decreased due to the effect of inverter series 205-2. In addition, the power consumption in inverter series 205-1 at this time is the extremely low level of the portion of the state transition loss ($CV^2f$). In addition, because diode 206-1 is turned ON and capacitor 207-1 is charged, consumption of power occurs in diode 206-1, but this power consumption is low because the resistance value of resistor 203-1 is high. As a result, power consumption in high-side driver 200-1 can be further decreased compared to the first exemplary embodiment.

In the present exemplary embodiment as described hereinabove, high-side driver 200-1 drives high-side gate 100-1 by way of inverter series 205-1.

If the first-stage inverter of inverter series 205-1 is here made small, the resistance value of resistor 203-1 can be increased while keeping the RC product small and maintaining high-speed operation. As a result, when internal amplifier element 201-1 is ON, the amount of current at resistor 203-1 can be decreased and power consumption can be decreased, whereby the effect is obtained in which power consumption in high-side driver 200-1 can be further reduced.

Since diode 206-1 and capacitor 207-1 are provided in high-side driver 200-1, the effect is obtained in which capacitor 207-1 is charged when internal amplifier element 201-1 is ON, and when internal amplifier element 201-1 is OFF, power can be supplied to inverter series 205-1 by means of the electric charge that was accumulated in capacitor 207-1. In addition, since the diode 206-1 is provided in high-side driver 200-1, the effect is also obtained in which the voltage of the input terminal of high-side driver 200-1 (i.e., the gate of internal amplifier element 201-1) can be prevented from falling below the ground voltage.

In the present exemplary embodiment, moreover, low-side driver 200-2 drives low-side gate 100-2 by way of inverter series 205-2.

As a result, similar to high-side driver 200-1, the effect is obtained in which the amount of current at resistor 203-2 can be made small to decrease power consumption when internal amplifier element 201-2 is ON, thereby enabling a further reduction of the power consumption in low-side driver 200-2.

(3) Third Exemplary Embodiment

Figure 9:
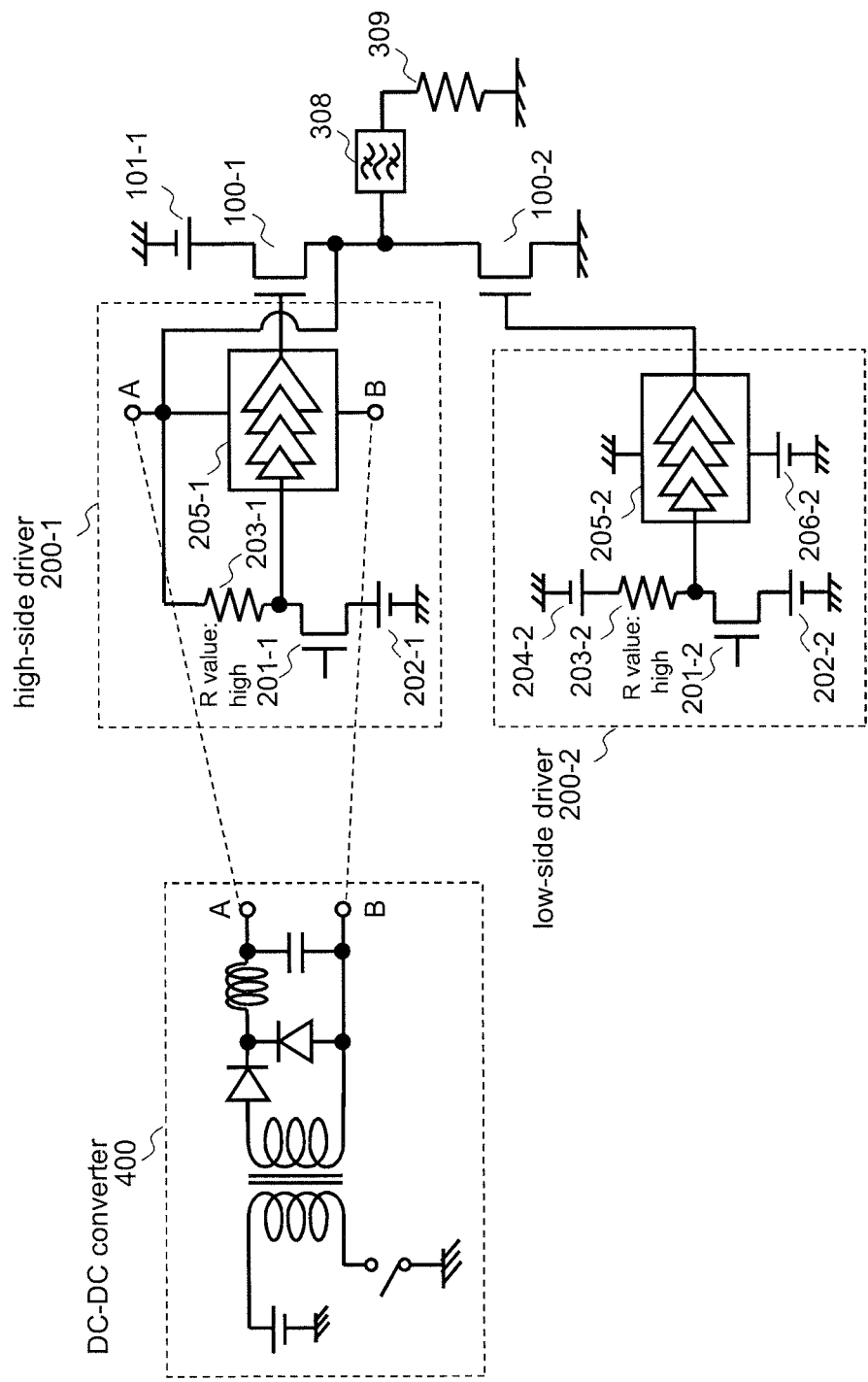
FIG. 9 is a circuit diagram showing an example of the configuration of the switching amplifier of the third exemplary embodiment of the present invention.

FIG. 9 shows an example of the configuration of the switching amplifier of the third exemplary embodiment of the present invention.

As shown in FIG. 9, the switching amplifier of the present exemplary embodiment is of a configuration in which the configurations of both high-side driver 200-1 and low-side driver 200-2 of the first exemplary embodiment shown in FIG. 5 have been altered.

More specifically, high-side driver 200-1 of the present exemplary embodiment is of a configuration in which inverter series (relay amplifier) 205-1 having a plurality of cascade-connected inverters is added to the first exemplary embodiment shown in FIG. 5, and in which the power-source terminal and ground terminal of inverter series 205-1 are each connected to a respective output terminal of the two output terminals of DC-DC converter 400 (output voltage: 5V).

To state in greater detail, inverter series 205-1 has its input terminal connected to the drain that serves as the output terminal of internal amplifier element 201-1, its output terminal connected to the gate that serves as the input terminal of high-side gate 100-1, its power-source terminal connected to the source that serves as the output terminal of high-side gate 100-1 and to one output terminal of DC-DC converter 400, and its ground terminal connected to the other output terminal of DC-DC converter 400.

In high-side driver 200-1 of the present exemplary embodiment, the stability of the power source is improved because the power supply is received from DC-DC converter 400. DC-DC converter 400 can use a known configuration, and explanation is therefore omitted.

High-side driver 200-1 of the present exemplary embodiment drives high-side gate 100-1 by way of inverter series 205-1.

If the first-stage inverter of inverter series 205-1 is made small, the RC product can be kept small even if the resistance value of resistor 203-1 is designed to be high (for example, 10Ω or 100Ω), and high-speed operation becomes possible. As a result, when internal amplifier element 201-1 is ON, the amount of current at resistor 203-1 can be made low to reduce the power consumption, whereby the power consumption in high-side driver 200-1 can be further reduced.

Low-side driver 200-2 of the present exemplary embodiment is the same as in the second exemplary embodiment shown in FIG. 7, and explanation of the configuration is therefore here omitted.

In addition, compared to the second exemplary embodiment, the switching amplifier of the present exemplary embodiment is equivalent to a configuration in which diode 206-1 and capacitor 207-1 are eliminated, the power-source terminal and ground terminal of inverter series 205-1 are each connected to a respective output terminal of the two output terminals of DC-DC converter 400, and the switching amplifier of the present exemplary embodiment implements operation that is substantially identical to the second exemplary embodiment, whereby explanation regarding operation is here omitted.

(4) Fourth Exemplary Embodiment

Figure 10:
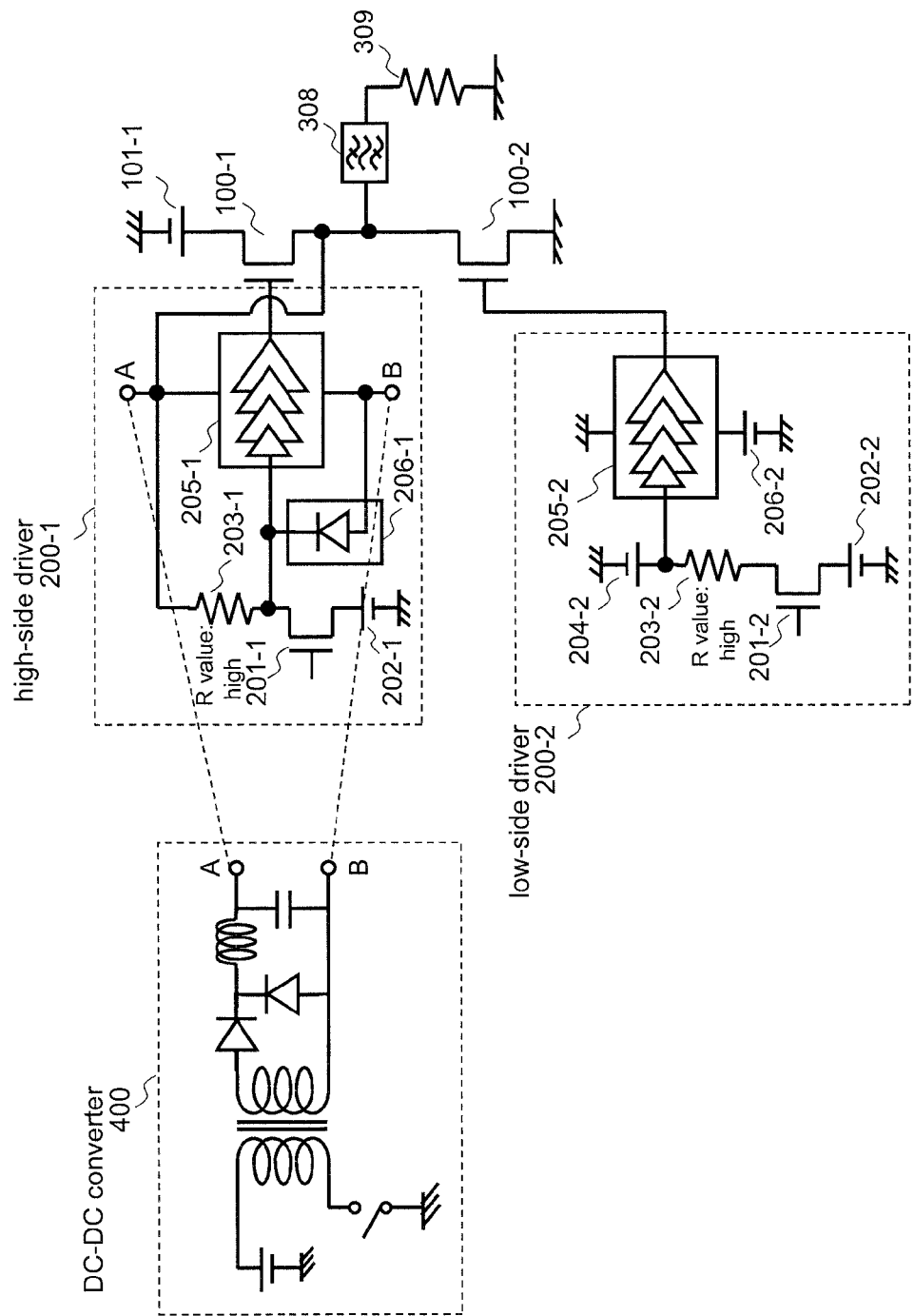
FIG. 10 is a circuit diagram showing an example of the configuration of the switching amplifier of the fourth exemplary embodiment of the present invention.

FIG. 10 shows an example of the configuration of the switching amplifier of the fourth exemplary embodiment of the present invention.

As shown in FIG. 10, the switching amplifier of the present exemplary embodiment is of a configuration in which the configuration of high-side driver 200-1 in the third exemplary embodiment shown in FIG. 9 has been altered.

More specifically, high-side driver 200-1 of the present exemplary embodiment is of a configuration in which diode 206-1 is added to the third exemplary embodiment shown in FIG. 9.

Diode 206-1 has its anode terminal connected to the ground terminal of inverter series 205-1 and its cathode terminal connected to the drain that serves as the output terminal of internal amplifier element 201-1.

High-side driver 200-1 of the present exemplary embodiment drives high-side gate 100-1 by way of inverter series 205-1.

If the first-stage inverter of inverter series 205-1 is made small, the RC product can be kept small even if the resistance value of resistor 203-1 is designed to be high (for example, 10Ω or 100Ω), and high-speed operation is possible. As a result, when internal amplifier element 201-1 is ON, the amount of current in resistor 203-1 can be made small to decrease the power consumption, whereby the power consumption in high-side driver 200-1 can be further decreased.

In addition, since diode 206-1 is provided in high-side driver 200-1 of the present exemplary embodiment, the voltage of the input terminal of high-side driver 200-1 (i.e., the gate of internal amplifier element 201-1) can be prevented from falling below the ground voltage.

Compared to the second exemplary embodiment, the switching amplifier of the present exemplary embodiment is equivalent to a configuration in which capacitor 207-1 is eliminated and in which the power-source terminal and ground terminal are each connected to a respective output terminal of the two output terminals of DC-DC converter 400, and carries out substantially the same operation as the second exemplary embodiment, and explanation of the operation is therefore here omitted.

(5) Fifth Exemplary Embodiment

As described hereinabove, in the first to fourth exemplary embodiments, high-side driver 200-1 uses the output terminal of high-side gate 100-1 as the power source.

However, high-side driver 200-1 is of a configuration in which the power-source voltage from the output terminal of high-side gate 100-1 is supplied to internal amplifier element 201-1 by way of only resistor 203-1, and as a result, when high-side gate 100-1 is ON during high-speed operation, the problem arises that, due to the input and output of electric charge to the gate capacitance of high-side gate 100-1, the pulses of the output voltage of the switching amplifier fail to attain the desired height and the linearity and efficiency of the switching amplifier drastically decrease.

In addition, low-side driver 200-2 is also of a configuration in which power-source voltage from power source 204-2 is supplied to internal amplifier element 201-2 by way of only resistor 203-2, whereby the same problem arises as for the high side when low-side gate 100-2 is turned ON during high-speed operation.

Taking as an example a case in which high-side gate 100-1 is turned ON in the configuration of the first exemplary embodiment, the above-described problem is described in detail with reference to FIGS. 11 and 12.

Figure 11:
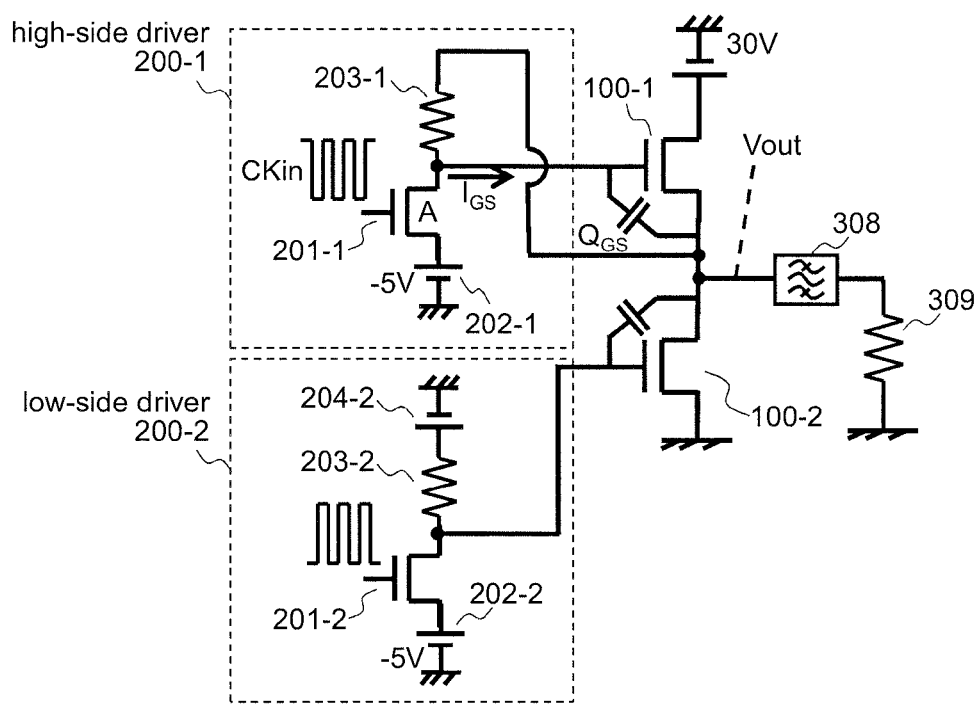
FIG. 11 is a circuit diagram showing an example of the configuration of the switching amplifier of the first exemplary embodiment of the present invention.

FIG. 11 shows the switching amplifier of the first exemplary embodiment. In FIG. 11, CKin is the signal applied as input to input terminal of internal amplifier element 201-1, $I_{GS}$ is the gate current of high-side gate 100-1, $Q_{GS}$ is the electric charge that is accumulated in the gate capacitance of high-side gate 100-1, and Vout is the output voltage of the switching amplifier.

Figure 12:
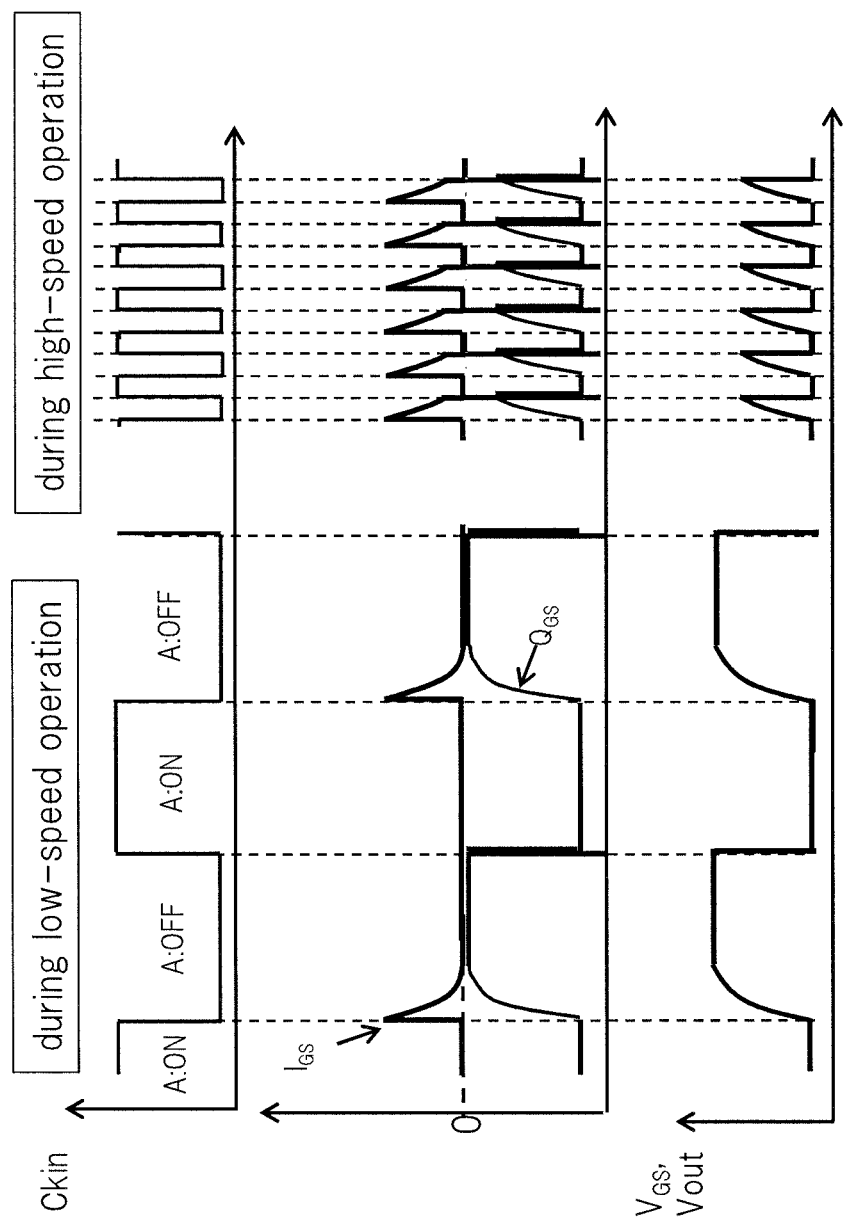
FIG. 12 is a view for describing waveforms during operation of the switching amplifier of the first exemplary embodiment of the present invention.

The upper section of FIG. 12 shows the waveform of CKin, the middle section shows the waveform of $I_{GS}$ and $Q_{GS}$, and the lower section shows the waveform of Vout. In the upper section of FIG. 12, internal amplifier element 201-1 is represented by "A," and "A: ON" and "A: OFF" indicate that internal amplifier element 201-1 is ON and OFF, respectively.

As shown in FIGS. 11 and 12, when high-side gate 100-1 is ON, internal amplifier element 201-1 is turned OFF by CKin and high-side gate 100-1 is turned ON. At this time, low-side gate 100-2 turns OFF. As a result, the phases of the signal applied as input to the input terminal of internal amplifier element 201-1 and the signal applied as input to the input terminal of low-side gate 100-2 are the same phase.

When internal amplifier element 201-1 is turned OFF, $I_{GS}$ instantaneously becomes large and then attenuates. Charging of $Q_{GS}$ to the gate capacitance of high-side gate 100-1 is started by this $I_{GS}$, and the gate capacitance is subsequently saturated.

This input and output of $Q_{GS}$ to the gate capacitance of high-side gate 100-1 brings about the occurrence of the so-called "rounding" in the rising edge of the Vout pulse.

During low-speed operation, however, due to the large pulse width of CKin, the Vout pulse attains the desired height during the interval in which internal amplifier element 201-1 is OFF despite the occurrence of rounding of the rising edge.

However, during high-speed operation, the pulse width of CKin is small, and the Vout pulse therefore fails to attain the desired height during the interval in which internal amplifier element 201-1 is OFF. As a result, the linearity and efficiency of the switching amplifier drastically decrease.

Figure 13:
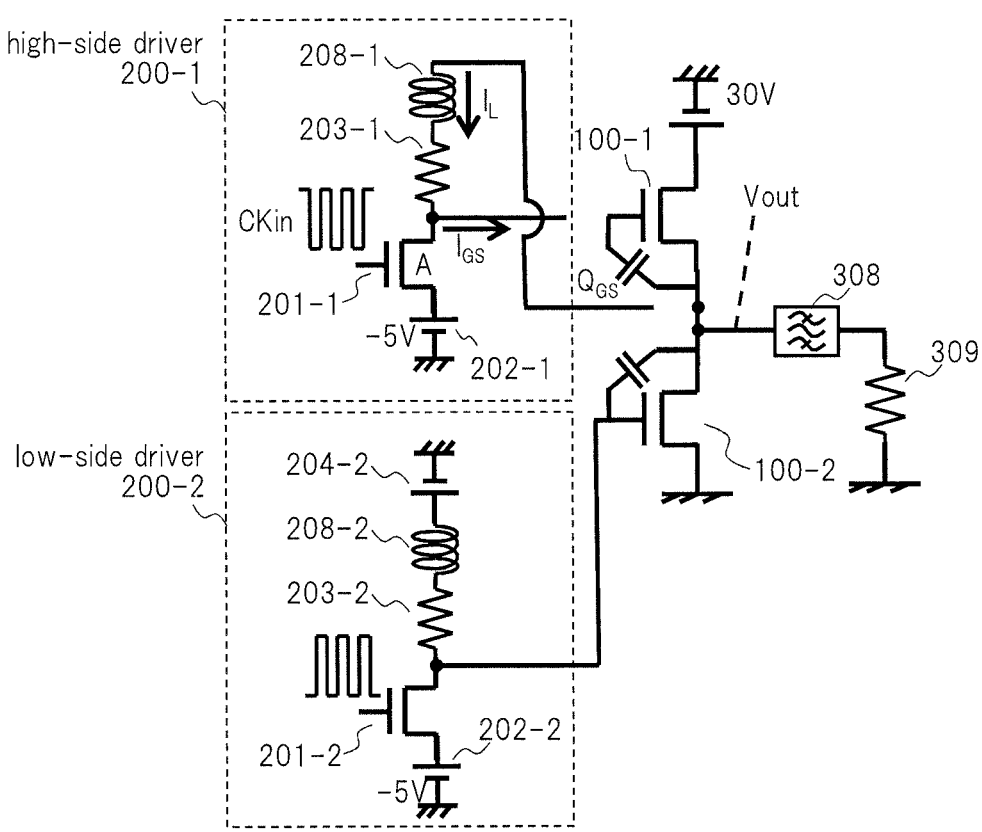
FIG. 13 is a circuit diagram showing an example of the configuration of the switching amplifier of the fifth exemplary embodiment of the present invention.

Therefore, compared to the first exemplary embodiment shown in FIG. 5, the switching amplifier of the present exemplary embodiment as shown in FIG. 13 connects inductor 208-1 in a series to resistor 203-1 in high-side driver 200-1. To state in greater detail, in the present exemplary embodiment, an input switching amplifier is made up by internal amplifier element 201-1, resistor 203-1, and inductor 208-1; one terminal of inductor 208-1 being connected to the source that serves as the output terminal of high-side gate 100-1, and the other terminal being connected to resistor 203-1. The positions of resistor 203-1 and inductor 208-1 may be switched.

In low-side driver 200-2, inductor 208-2 is connected in a series to resistor 203-2. To state in greater detail, in the present exemplary embodiment, one terminal of inductor 208-2 is connected to power source 204-2, and the other terminal is connected to resistor 203-2. The positions of resistor 203-2 and inductor 208-2 may be switched.

The operation of the switching amplifier of the present exemplary embodiment is next described with reference to FIGS. 13 and 14, taking as an example a case in which high-side gate 100-1 is ON.

In FIG. 13, $I_L$ is the current that flows in inductor 208-1. The other values CKin, $I_{GS}$, $Q_{GS}$, and Vout are the same as in FIGS. 11 and 12.

Figure 14:
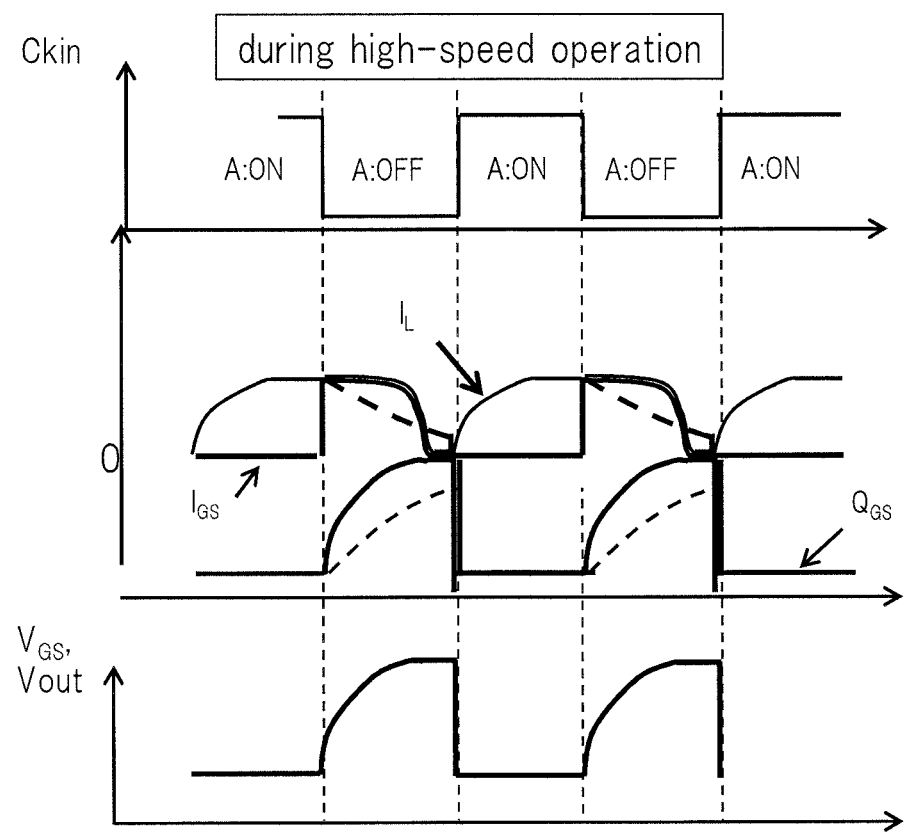
FIG. 14 is a view for describing waveforms during operation of the switching amplifier of the fifth exemplary embodiment of the present invention.

In addition, the waveform of $I_L$ is shown in addition to $I_{GS}$ and $Q_{GS}$ in the middle section of FIG. 14. The upper and lower sections of FIG. 14 are the same as FIG. 12. However, FIG. 14 shows only waveforms during high-speed operation. In addition, although the pulse widths of CKin during high-speed operation are actually the same in FIG. 12 and FIG. 14, the pulse width is shown larger in FIG. 14 to facilitate understanding of the present invention.

As shown in FIG. 13 and FIG. 14, when high-side gate 100-1 is ON, internal amplifier element 201-1 is turned OFF by CKin, whereupon $I_{GS}$ becomes large instantaneously.

At this time, in the case of the configuration of the first exemplary embodiment of FIG. 11 in which inductor 208-1 is not connected, $I_{GS}$ that flows into the gate capacitance of high-side gate 100-1 immediately begins to attenuate (refer to the broken-line waveform of $I_{GS}$ in the middle section of FIG. 14).

On the other hand, in the case of the configuration of the present exemplary embodiment of FIG. 13 in which inductor 208-1 is connected, $I_L$ operates so as to maintain a fixed value due to the peaking characteristic of inductor 208-1, and the attenuation of $I_{GS}$ is avoided for a fixed time interval by means of this $I_L$ (refer to the solid-line waveform of $I_{GS}$ of the middle section of FIG. 14).

As a result, even during high-speed operation, the gate capacitance of high-side gate 100-1 is saturated by the time attenuation of $I_{GS}$ starts, and the Vout pulse attains the desired height during the interval that internal amplifier element 201-1 is OFF.

The operation relating to the input and output of electric charge to the gate capacitance when low-side gate 100-2 is ON is substantially the same as when high-side gate 100-1 is ON, and explanation is therefore here omitted.

The other operation is substantially identical to the first exemplary embodiment, and explanation is therefore here omitted.

As described hereinabove, in the present exemplary embodiment, inductor 208-1 is connected in a series to resistor 203-1 in high-side driver 200-1.

Accordingly, the Vout pulse attains the desired height even when high-side gate 100-1 is ON during high-speed operation, and the effect is therefore obtained in which the linearity and efficiency of the switching amplifier can be achieved.

In low-side driver 200-2 as well, inductor 208-2 is connected in a series to resistor 203-2.

Accordingly, the Vout pulse attains the desired height even when low-side gate 100-2 is ON during high-speed operation, whereby the effect is obtained in which linearity and efficiency of the switching amplifier can be achieved.

The other effects are the same as in the first exemplary embodiment.

Finally, the switching amplifier of the present exemplary embodiment is not limited to the configuration of the first exemplary embodiment as described hereinabove and can be applied in the configurations of the second to fourth exemplary embodiments.

(6) Sixth Exemplary Embodiment

Taking as an example the configuration of the first exemplary embodiment, voltage $V_{GS}$ across the gate and source of high-side gate 100-1 when high-side gate 100-1 is turned ON and OFF is first described with reference to FIGS. 15 and 16.

Figure 15:
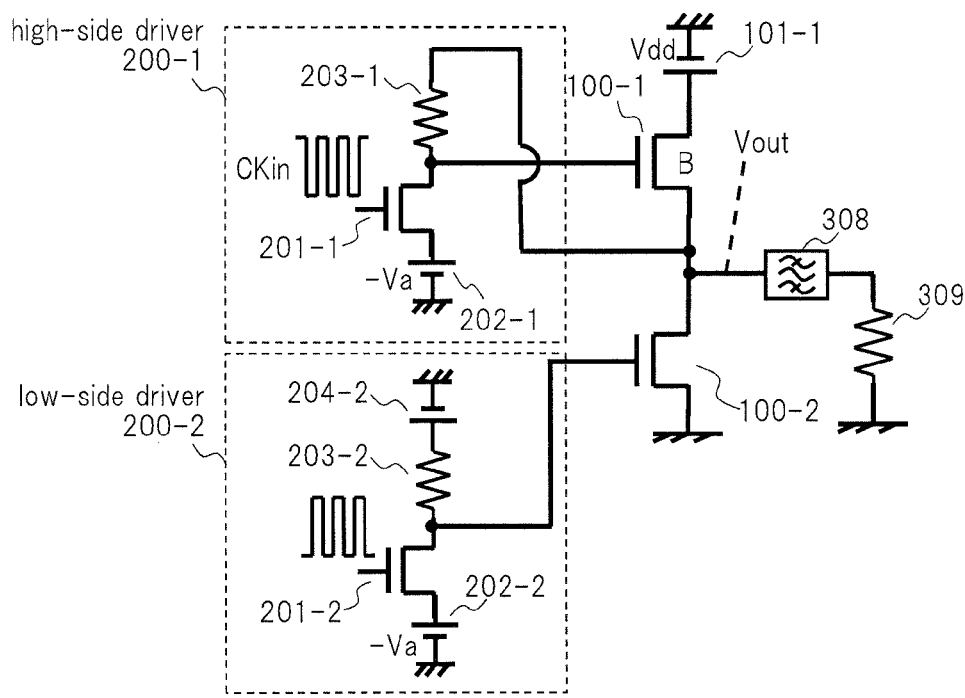
FIG. 15 is a circuit diagram showing an example of the configuration of the switching amplifier of the first exemplary embodiment of the present invention.

FIG. 15 shows the switching amplifier of the first exemplary embodiment. In FIG. 15, CKin is the signal applied as input to the input terminal of internal amplifier element 201-1, −Va is the power-source voltage of power source 202-1, Vdd is the power-source voltage of power source 101-1, and Vout is the output voltage of the switching amplifier.

Figure 16:
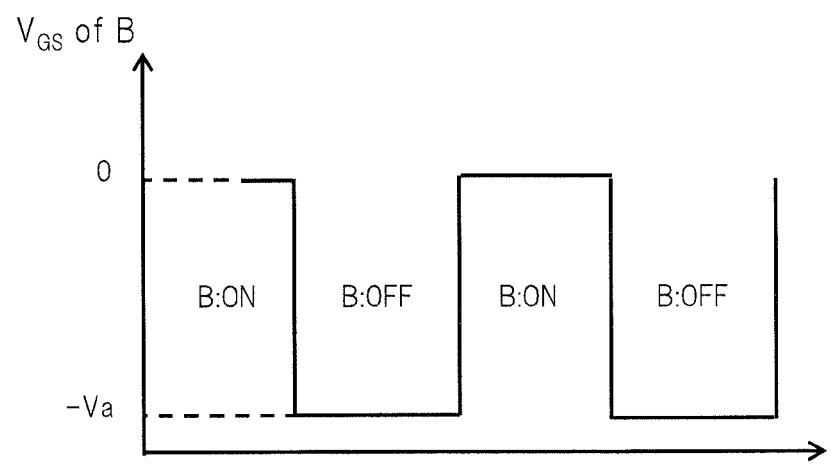
FIG. 16 is a view for describing voltage $V_{GS}$ across the gate and source of high-side gate 100-1 of the last stage in the switching amplifier of the first exemplary embodiment of the present invention.

FIG. 16 shows voltage $V_{GS}$ across the gate and source of high-side gate 100-1. In FIG. 16, "B" represents high-side gate 100-1, and "B: ON" and "B: OFF" indicate that high-side gate 100-1 is ON and OFF, respectively.

As shown in FIGS. 15 and 16, when high-side gate 100-1 is turned OFF, $V_{GS}$ of high-side gate 100-1 becomes −Va, which is the power-source voltage of power source 202-1. As a result, $V_{GS}$ that turns OFF high-side gate 100-1 can be set by setting Va.

On the other hand, when high-side gate 100-1 is turned ON, $V_{GS}$ of high-side gate 100-1 is 0V.

Even though $V_{GS}$ is 0V in this case, if high-side gate 100-1 is made of a GaN (gallium nitride) FET, the problem of increased ON resistance does not occur because a GaN FET has a characteristic in which ON resistance is low.

However, the ON resistance of high-side gate 100-1 becomes high depending on the device that makes up high-side gate 100-1 (for example, a GaAs (gallium arsenide) FET), resulting in the drastic decrease of the efficiency of the switching amplifier.

Figure 17:
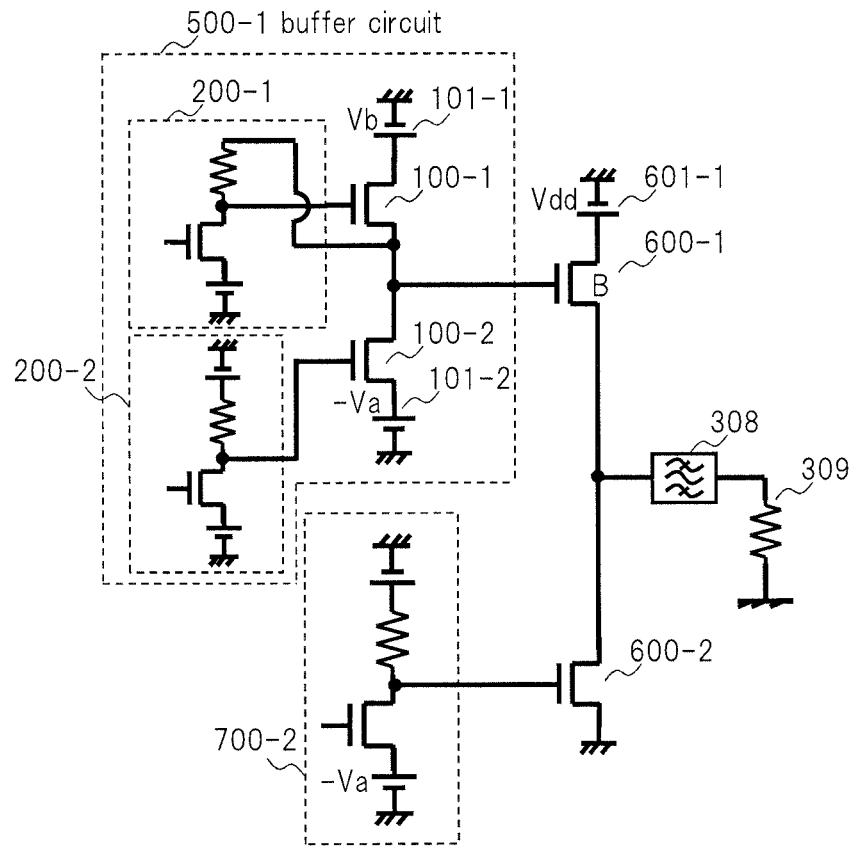
FIG. 17 is a circuit diagram showing an example of the configuration of the switching amplifier of the sixth exemplary embodiment of the present invention.

In the switching amplifier of the present exemplary embodiment as shown in FIG. 17, a buffer circuit (first buffer circuit) 500-1 is formed by the configuration of the first exemplary embodiment shown in FIG. 5; high-side gate (second high-side gate) 600-1, power source 601-1, low-side gate (second low-side gate) 600-2, and low-side driver 700-2 are newly added; and further, buffer circuit 500-1 is inserted into the stage that precedes high-side gate 600-1. In other words, in the present exemplary embodiment, the output terminal of buffer circuit 500-1 is connected to the gate that serves as the input terminal of high-side gate 600-1. However, in buffer circuit 500-1, power source 101-2 having a power-source voltage of −Va, rather than ground, is connected to the drain that serves as the power-source terminal of low-side gate 100-2 in order to control $V_{GS}$ that turns OFF high-side gate 600-1.

High-side gate 600-1, low-side gate 600-2, and low-side driver 700-2 each have the same configuration and perform the same operations as high-side gate 100-1, low-side gate 100-2, and low-side driver 200-2, respectively, in the first exemplary embodiment, and explanation is therefore here omitted.

The voltage $V_{GS}$ across the gate and source of high-side gate 600-1 when high-side gate 600-1 is turned ON and OFF in the switching amplifier of the present exemplary embodiment is next described with reference to FIGS. 17 and 18.

In FIG. 17, Vb is the power-source voltage of power source 101-1, −Va is the power-source voltage of power source 101-2, and Vdd is the power-source voltage of power source 601-1.

Figure 18:
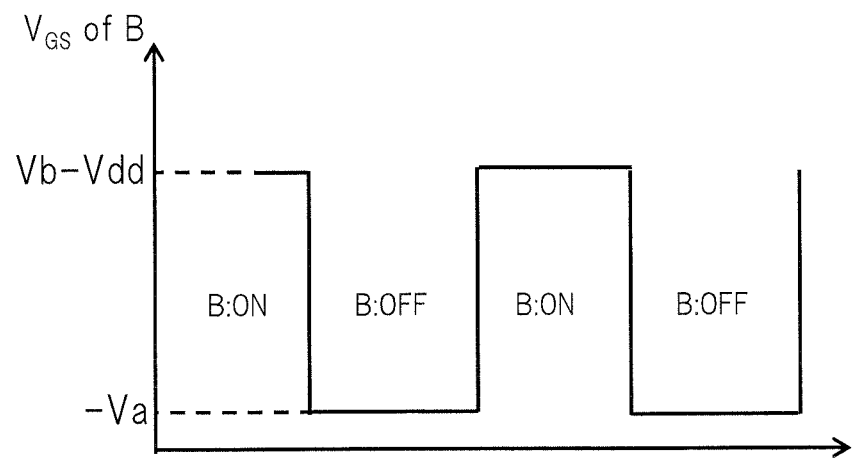
FIG. 18 is a view for describing voltage $V_{GS}$ across the gate and source of high-side gate 600-1 of the last stage in the switching amplifier of the sixth exemplary embodiment of the present invention.

FIG. 18 shows voltage $V_{GS}$ across the gate and source of high-side gate 600-1. In FIG. 18, "B" represents high-side gate 600-1, and "B: ON" and "B: OFF" represent that high-side gate 600-1 is turned ON and OFF, respectively.

As shown in FIGS. 17 and 18, when high-side gate 600-1 is turned OFF, $V_{GS}$ of high-side gate 600-1 becomes −Va that is the power-source voltage of power source 101-2. This point is the same as for $V_{GS}$ of high-side gate 100-1 in FIGS. 15 and 16.

On the other hand, when high-side gate 600-1 is turned ON, $V_{GS}$ of high-side gate 600-1 becomes Vb−Vdd, which is the difference between power-source voltage Vb of power source 101-1 and power-source voltage Vdd of power source 601-1.

As a result, by making Vb greater than Vdd (i.e., Vb=Vdd+α), $V_{GS}$ of high-side gate 600-1 can be made greater than 0V, and the ON resistance of high-side gate 600-1 can be decreased. The value of α can be set within the range of 0V~1V, although no particular limitation applies to the value.

As described hereinabove, in the present exemplary embodiment, buffer circuit 500-1 is formed by the configuration of the first exemplary embodiment shown in FIG. 5, and buffer circuit 500-1 is inserted into the stage that precedes high-side gate 600-1.

Accordingly, when high-side gate 600-1 is turned ON, $V_{GS}$ of high-side gate 600-1 becomes Vb−Vdd, and the ON resistance of high-side gate 600-1 can be decreased, whereby the effect is obtained in which the efficiency of the switching amplifier can be improved.

The other effects are the same as in the first exemplary embodiment.

Because the switching amplifier of the present exemplary embodiment forms buffer circuit 500-1 by the first exemplary embodiment shown in FIG. 5, the efficiency of buffer circuit 500-1 itself decreases. However, because the efficiency of high-side gate 600-1 of the last stage is the dominant factor in the overall efficiency of the switching amplifier, even should the efficiency of buffer circuit 500-1 itself decrease, the influence of this decrease upon the overall efficiency can be ignored.

The switching amplifier of the present exemplary embodiment is not limited to forming buffer circuit 500-1 by the configuration of the first exemplary embodiment as described hereinabove, and buffer circuit 500-1 can also be formed by the configurations of the second to fourth exemplary embodiments.

(7) Seventh Exemplary Embodiment

Figure 19:
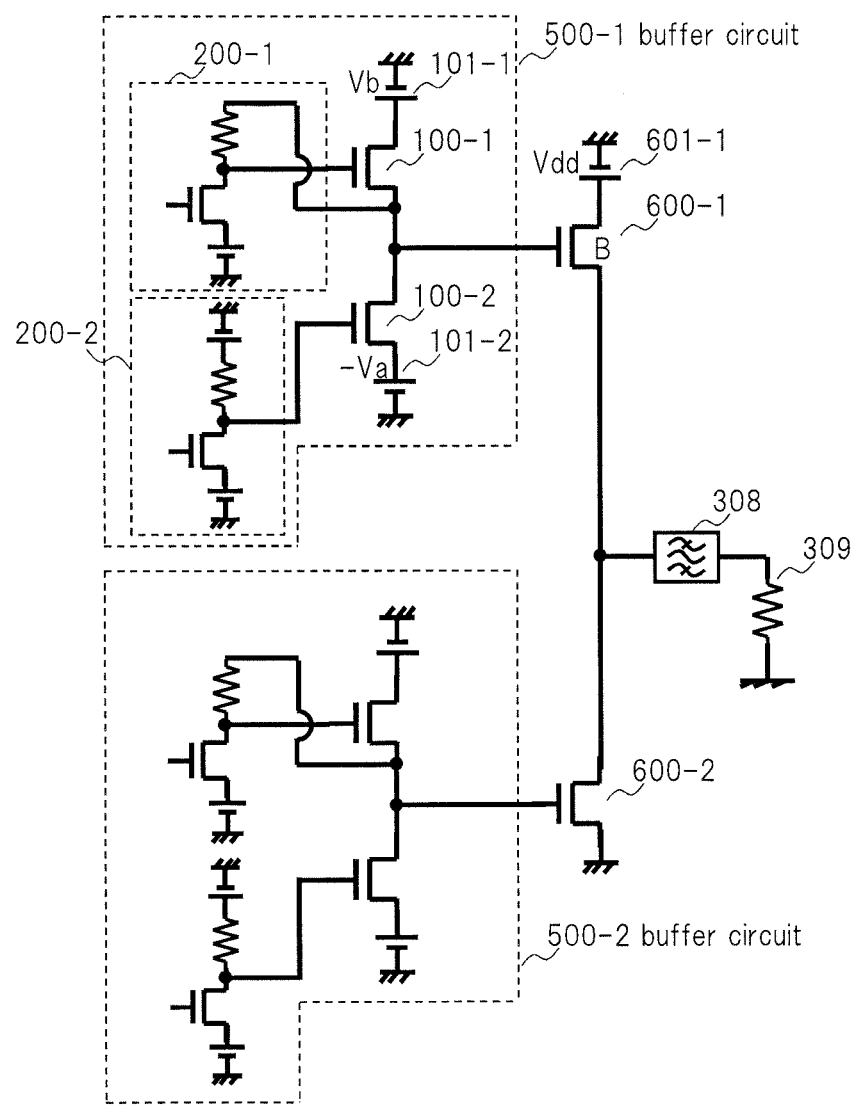
FIG. 19 is a circuit diagram showing an example of the configuration of the switching amplifier of the seventh exemplary embodiment of the present invention.

FIG. 19 shows an example of the configuration of the switching amplifier of the seventh exemplary embodiment of the present invention.

As shown in FIG. 19, the switching amplifier of the present exemplary embodiment is of a configuration in which, compared to the sixth exemplary embodiment shown in FIG. 17, low-side driver 700-2 is replaced by buffer circuit (second buffer circuit) 500-2 that is of the same configuration as buffer circuit 500-1.

In other words, the switching amplifier of the present exemplary embodiment is provided with two sets of the configuration of the first exemplary embodiment shown in FIG. 5, buffer circuit 500-1 being formed by one set and buffer circuit 500-2 being formed by the other set. Buffer circuit 500-1 is inserted in the stage that precedes high-side gate 600-1, and buffer circuit 500-2 is inserted in the stage that precedes low-side gate 600-2.

Accordingly, the ON resistance of low-side gate 600-2 can be decreased even when low-side gate 600-2 is turned ON, thereby obtaining the effect of enabling a further improvement of the efficiency of the switching amplifier.

The other effects are the same as in the sixth exemplary embodiment.

(8) Eighth Exemplary Embodiment

Figure 20:
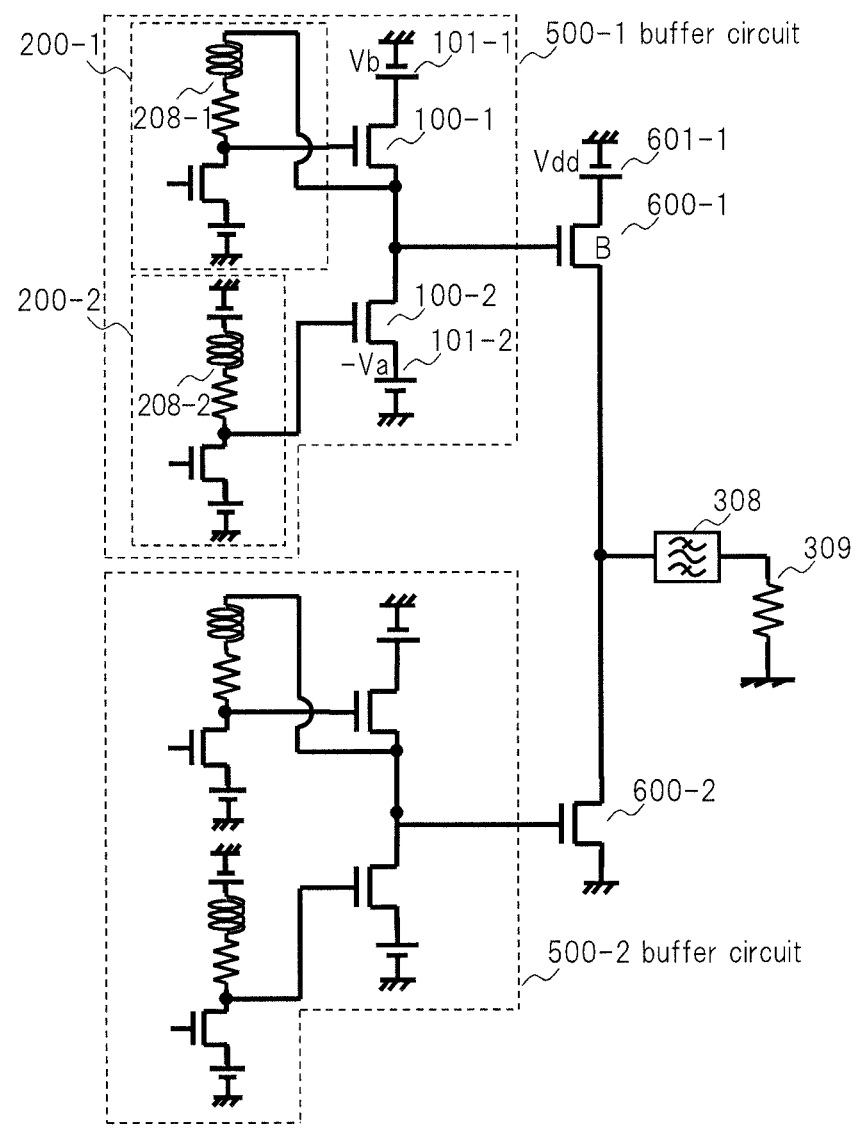
FIG. 20 is a circuit diagram showing an example of the configuration of the switching amplifier of the eighth exemplary embodiment of the present invention.

FIG. 20 shows an example of the configuration of the switching amplifier of the eighth exemplary embodiment of the present invention.

As shown in FIG. 20, the switching amplifier of the present exemplary embodiment is of a configuration in which, compared to the seventh exemplary embodiment shown in FIG. 19, inductors 208-1 and 208-2 of the fifth exemplary embodiment shown in FIG. 13 are added to each of buffer circuits 500-1 and 500-2.

In other words, the switching amplifier of the present exemplary embodiment corresponds to a configuration in which buffer circuits 500-1 and 500-2 are formed by the configuration of the fifth exemplary embodiment shown in FIG. 13.

Accordingly, the pulse of the output voltage attains the desired height even when high-side gate 100-1 or low-side gate 100-2 is turned ON during high-speed operation, thereby obtaining the effects of enabling both an improvement of the linearity of the switching amplifier and a further improvement of the efficiency of the switching amplifier.

The other effects are the same as in the seventh exemplary embodiment.

Although the present invention has been described with reference to exemplary embodiments, the present invention is not limited to the above-described exemplary embodiments. The configuration and details of the present invention are open to various modifications within the scope of the present invention that will be clear to one of ordinary skill in the art.

In the first exemplary embodiment, for example, low-side driver 200-2 was provided with the configuration as shown in FIG. 3, and in the second to fourth exemplary embodiments, low-side driver 200-2 was provided with a configuration in which inverter series 205-2 was added to the configuration shown in FIG. 3, but low-side driver 200-2 in either configuration has low power consumption and therefore may be of either configuration.

In addition, in the second to fourth exemplary embodiments, inverter series 205-1 and 205-2 were used as relay amplifiers, but the relay amplifiers may also be common amplifiers and are not limited to an inverter series.

Still further, in the first to fifth exemplary embodiments, the switching amplifier of the present invention was assumed to be incorporated in a transmitter corresponding to a binary-output delta-sigma modulator, and each embodiment was of a configuration having one set of high-side gate 100-1 and high-side driver 200-1 and one set of low-side gate 100-2 and low-side driver 200-2. However, the present invention is not limited to this form and may have one or more of each of these sets corresponding to the number of outputs of a delta-sigma modulator. For example, switching amplifier 307 shown in FIG. 1 has three switch elements corresponding to three-value output delta-sigma modulator 305. In this case, two switch elements that are connected to power sources (Vdd and Vdd/2) are applied as the high-side gate and a switch element connected to GND is applied as the low-side gate. As a result, this switching amplifier has two sets of high-side gate 100-1 and high-side driver 200-1 and one set of low-side gate 100-2 and low-side driver 200-2.

In addition, in the sixth to eighth exemplary embodiments, the switching amplifier of the present invention was assumed to be incorporated in a transmitter corresponding to a binary-output delta-sigma modulator, and each embodiment was of a configuration having one set of high-side gate 600-1 and buffer circuit 500-1 and one set of low-side gate 600-2 and low-side driver 700-2 (or buffer circuit 500-2). However, the present invention is not limited to this form and may have one or more of each of these sets to correspond to the number of outputs of a delta-sigma modulator. For example, switching amplifier 307 shown in FIG. 1 has three switch elements to correspond to three-value output delta-sigma modulator 305. In this case, the two switch elements that are connected to power sources (Vdd and Vdd/2) are applied as high-side gates, and a switch element connected to GND is applied as the low-side gate. As a result, this switching amplifier has two sets of high-side gate 600-1 and buffer circuit 500-1 and one set of low-side gate 600-2 and low-side driver 700-2 (or buffer circuit 500-2).

What is claimed is:

1. A switching amplifier that includes a first high-side gate and a first low-side gate having output terminals connected together and a high-side driver and low-side driver that drive said first high-side gate and said first low-side gate, respectively, wherein:

said high-side driver includes an input switching amplifier that uses an output terminal of said first high-side gate as a power source; and said high-side driver further includes a relay amplifier having an input terminal connected to an output terminal of said input switching amplifier and an output terminal connected to an input terminal of said first high-side gate.

2. The switching amplifier as set forth in claim 1, wherein said relay amplifier is an inverter series in which a plurality of inverters are cascade-connected.

3. The switching amplifier as set forth in claim 1, wherein said high-side driver further comprises:

a diode having its anode terminal connected to the ground terminal of said relay amplifier and its cathode terminal connected to the output terminal of said input switching amplifier; and a capacitor having one terminal connected to the ground terminal of said relay amplifier and the other terminal connected to the output terminal of said first high-side gate.

4. The switching amplifier as set forth in claim 1, wherein a power-source terminal and ground terminal of said relay amplifier are each connected to a respective output terminal of the two output terminals of a DC-DC converter.

5. The switching amplifier as set forth in claim 4, wherein said high-side driver further includes a diode having its anode terminal connected to a ground terminal of said relay amplifier and its cathode terminal connected to an output terminal of said input switching amplifier.

6. The switching amplifier as set forth in claim 1, wherein said input switching amplifier includes a resistor and an internal amplifier element, and said resistor is connected between the output terminal of said first high-side gate and the output terminal of said internal amplifier element.

7. The switching amplifier as set forth in claim 1, comprising a plurality of sets of said first high-side gate and said high-side driver.

8. A transmitter that uses the switching amplifier as set forth in claim 1.

9. A switching amplifier that includes a first high-side gate and a first low-side gate having output terminals connected together and a high-side driver and low-side driver that drive said first high-side gate and said first low-side gate, respectively, wherein:
   said high-side driver includes an input switching amplifier that uses an output terminal of said first high-side gate as a power source;
   wherein said input switching amplifier includes a resistor and an internal amplifier element, and said resistor is connected between the output terminal of said first high-side gate and the output terminal of said internal amplifier element; and
   said input switching amplifier further includes an inductor, and said inductor is connected in a series with said resistor.

10. A switching amplifier that includes a first high-side gate and a first low-side gate having output terminals connected together and a high-side driver and low-side driver that drive said first high-side gate and said first low-side gate, respectively, wherein:
    said high-side driver includes an input switching amplifier that uses an output terminal of said first high-side gate as a power source; and
    said first high-side gate, said first low-side gate, said high-side driver, and said low-side driver form a first buffer circuit; the switching amplifier further comprising:
    a second high-side gate having an input terminal connected to an output terminal of said first buffer circuit; and
    a second low-side gate;
    wherein said second high-side gate and said second low-side gate have output terminals that are connected together.

11. The switching amplifier as set forth in claim 10, comprising a plurality of sets of said second high-side gate and said first buffer circuit.

12. A switching amplifier that includes a first high-side gate and a first low-side gate having output terminals connected together and a high-side driver and low-side driver that drive said first high-side gate and said first low-side gate, respectively, wherein:
    said high-side driver includes an input switching amplifier that uses an output terminal of said first high-side gate as a power source; the switching amplifier further comprising:
    two sets, each set being made up by said first high-side gate, said first low-side gate, said high-side driver, and said low-side driver, one set forming a first buffer circuit and the other set forming a second buffer circuit;
    a second high-side gate having an input terminal connected to an output terminal of said first buffer circuit; and
    a second low-side gate having an input terminal connected to an output terminal of said second buffer circuit;
    wherein said second high-side gate and said second low-side gate have output terminals that are connected together.

* * * * *